United States Patent
Ikeda et al.

(10) Patent No.: US 6,829,121 B2
(45) Date of Patent: Dec. 7, 2004

(54) MAGNETORESISTIVE ELEMENT, MEMORY ELEMENT HAVING THE MAGNETORESISTIVE ELEMENT, AND MEMORY USING THE MEMORY ELEMENT

(75) Inventors: Takashi Ikeda, Kanagawa (JP); Akio Koganei, Chiba (JP); Kazuhisa Okano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/113,983

(22) Filed: Apr. 2, 2002

(65) Prior Publication Data

US 2002/0182442 A1 Dec. 5, 2002

(30) Foreign Application Priority Data

Apr. 2, 2001 (JP) ........................................ 2001/103185
Aug. 13, 2001 (JP) ........................................ 2001/245423

(51) Int. Cl.$^7$ .............................. G11B 5/127; G11B 5/39
(52) U.S. Cl. ................................. 360/324.1; 360/324.2; 428/611; 428/686; 428/212; 428/692; 427/526; 427/528; 427/531; 427/598
(58) Field of Search .................................. 428/692, 693, 428/209, 210, 611, 686, 212; 360/313, 324.1, 324.2; 427/526, 528, 531, 598

(56) References Cited

U.S. PATENT DOCUMENTS

| | | | |
|---|---|---|---|
| 5,652,054 A | 7/1997 | Kikitsu et al. | 428/328 |
| 5,726,837 A | 3/1998 | Nakatani et al. | 360/113 |
| 5,729,410 A | 3/1998 | Fontana, Jr. et al. | 360/113 |
| 6,219,275 B1 | 4/2001 | Mishimura | 365/173 |
| 6,565,929 B2 * | 5/2003 | Gurovich et al. | 427/523 |
| 2001/0018107 A1 * | 8/2001 | Ishii | 428/65.3 |
| 2002/0044479 A1 * | 4/2002 | Ikeda | 365/145 |
| 2002/0131214 A1 * | 9/2002 | Covington et al. | 360/324 |

FOREIGN PATENT DOCUMENTS

| | | | |
|---|---|---|---|
| GB | 896703 | 5/1962 | |
| JP | 03-108144 | * 5/1991 | ........... G11B/11/10 |

OTHER PUBLICATIONS

Mutsuko Jimbo, et al., "Giant Magnetoresistance In Soft Magnetic NiFeCo/Cu Multilayers With Various Buffer Layers", Journal of Magnetism and Magnetic Materials 126 (1993), pp. 422–424.

V.O. Vas'kovskij, et al., "Amorphous Gadolinium–Cobalt Films With In–plane Anisotropy For Magnetoresistive Sandwiches", Journal of Magnetism and Magnetic Materials 156 (1996), pp. 291–292.

Patent Abstracts of Japan Application No. 11–109571, filed Apr. 16, 1999; Publication No. 2000–306374, published Feb. 11, 2000.

* cited by examiner

*Primary Examiner*—Paul Thibodeau
*Assistant Examiner*—Kevin M. Bernatz
(74) *Attorney, Agent, or Firm*—Fitzpatrick, Cella, Harper & Scinto

(57) ABSTRACT

A magnetoresistive film includes a nonmagnetic film, and a structure in which magnetic films are formed on the two sides of the nonmagnetic film. At least one of the magnetic films is a perpendicular magnetization film. A magnetic film whose easy axis of magnetization is inclined from a direction perpendicular to the film surface is formed at a position where the magnetic film contacts the perpendicular magnetization film but does not contact the nonmagnetic film. A memory, magnetic element, magnetoresistive element, and magnetic element manufacturing method are also disclosed.

19 Claims, 14 Drawing Sheets

↑ MAGNETIZATION OF TRANSITION METAL

↑ MAGNETIZATION OF RARE EARTH ELEMENT

⇑ COMBINED MAGNETIZATION

"1"

"0"

MAGNETORESISTIVE ELEMENT, MEMORY ELEMENT HAVING THE MAGNETORESISTIVE ELEMENT, AND MEMORY USING THE MEMORY ELEMENT

BACKGROUND OF THE INVENTION

1. Field of the Invention

The present invention relates to a magnetoresistive element using a method of reducing magnetic field inverting magnetization thereinafter, referred to as switching field of a magnetic film, a memory element having the magnetoresistive element, and a memory using the memory element.

2. Related Background Art

In recent years, semiconductor memories as solid-state memories are adopted in many information devices, and are of various types such as a DRAM, FeRAM, and flash EEPROM. The characteristics of the semiconductor memories have merits and demerits. There is no memory which satisfies all specifications required by current information devices. For example, the DRAM achieves high recording density and large rewritable count, but is volatile and loses its information upon power-off. The flash EEPROM is nonvolatile, but takes a long erase time and is not suitable for high-speed information processing.

Under the present circumstances of semiconductor memories, a magnetic memory (MRAM: Magnetic Random Access Memory) using a magnetoresistive element is promising as a memory which satisfies all specifications required by many information devices in terms of the recording time, read time, recording density, rewritable count, power consumption, and the like. In particular, an MRAM using a spin-dependent tunneling magnetoresistive (TMR) effect is advantageous in high-density recording or high-speed read because a large read signal can be obtained. Recent research reports verify the feasibility of MRAMs.

The basic structure of a magnetoresistive film used as an MRAM element is a sandwich structure in which magnetic layers are formed adjacent to each other via a nonmagnetic layer. Known examples of the material of the nonmagnetic film are Cu and $Al_2O_3$. A magnetoresistive film using a conductor such as Cu in a nonmagnetic layer is called a GMR film (Giant MagnetoResistive film). A magnetoresistive film using an insulator such as $Al_2O_3$ is called a spin-dependent TMR film (Tunneling MagnetoResistive film). In general, the TMR film exhibits a larger magnetoresistance effect than the GMR film.

When the magnetization directions of two magnetic layers are parallel to each other, as shown in FIG. 13A, the resistance of the magnetoresistive film is relatively low. When these magnetization directions are antiparallel, as shown in FIG. 13B, the resistance is relatively high. One of the magnetic layers is formed as a recording layer, and the other layer is as a read layer. Information can be read out by utilizing the above property. For example, a magnetic layer 13 on a nonmagnetic layer 12 is formed as a recording layer, and a magnetic layer 14 below the nonmagnetic layer 12 is as a read layer. The rightward magnetization direction of the recording layer is defined as "1", and the leftward direction is as "0". If the magnetization directions of the two magnetic layers are rightward, as shown in FIG. 14A, the resistance of the magnetoresistive film is relatively low. If the magnetization direction of the read layer is rightward and that of the recording layer is leftward, as shown in FIG. 14B, the resistance is relatively high. If the magnetization direction of the read layer is leftward and that of the recording layer is rightward, as shown in FIG. 14C, the resistance is relatively high. If the magnetization directions of the two magnetic layers are leftward, as shown in FIG. 14D, the resistance is relatively low. That is, when the magnetization direction of the read layer is pinned rightward, "0" is recorded in the recording layer for a high resistance, and "1" is recorded for a low resistance. Alternatively, when the magnetization direction of the read layer is pinned leftward, "1" is recorded in the recording layer for a high resistance, and "0" is recorded for a low resistance.

As the element is downsized for a higher recording density of an MRAM, the MRAM using an in-plane magnetization film becomes more difficult to hold information under the influence of a demagnetizing field or magnetization curling at the end face. To avoid this problem, for example, a magnetic layer is formed into a rectangle. This method cannot downsize the element, so an increase in recording density cannot be expected. U.S. Pat. No. 6,219,275 has proposed the use of a perpendicular magnetization film to avoid the above problem. According to this method, the magnetizing field does not increase even with a smaller element size. A smaller-size magnetoresistive film can be realized, compared to an MRAM using an in-plane magnetization film. Similar to a magnetoresistive film using an in-plane magnetization film, a magnetoresistive film using a perpendicular magnetization film exhibits a relatively low resistance when the magnetization directions of two magnetic layers are parallel to each other, and a relatively high resistance when these magnetization directions are antiparallel. As shown in FIGS. 15A to 15D, a magnetic layer 23 on a nonmagnetic layer 22 is formed as a recording layer, and a magnetic layer 21 below the nonmagnetic layer 22 is as a read layer. The upward magnetization direction of the recording layer is defined as "1", and the downward direction is as "0". As FIGS. 14A to 14D showed, it can compose as a memory element.

Main examples of the perpendicular magnetization film are an alloy film or artificial lattice film made of at least one element selected from the group consisting of rear-earth metals such as Gd, Dy, and Tb and at least one element selected from the group consisting of transition metals such as Co, Fe, and Ni, an artificial lattice film made of a transition metal and noble metal such as Co/Pt, and an alloy film having crystallomagnetic anisotropy in a direction perpendicular to the film surface, such as CoCr. In general, the switching field of a perpendicular magnetization film is larger than that having longitudinal magnetic anisotropy by a transition metal. For example, the switching field of a permalloy as an in-plane magnetization film is about several hundred A/m. The switching field of a Co/Pt artificial lattice film as a perpendicular magnetization film is as very high as about several ten kA/m. An alloy film of a rear-earth metal and transition metal exhibits different apparent magnetization intensities depending on the film composition because the sub-lattice magnetization of the rear-earth metal and that of the transition metal orient antiparallel to each other. Hence, the switching field of this alloy film changes depending on the composition. A GdFe alloy film shows a relatively small switching field among alloy films of rear-earth metals and transition metals. In general, the GdFe alloy film has a switching field of about several thousand A/m around the critical composition at which the squareness ratio of the magnetization curve starts decreasing from 1.

When a sensor, memory, or the like is formed from a magnetoresistive film using a perpendicular magnetization film, the sensor, memory, or the like cannot operate unless a large magnetic field is applied owing to the above-described reason. For example, in the sensor, a stray field must be concentrated on the magnetic layer of the magnetoresistive film. In the memory, a large magnetic field must be generated. A magnetic field applied to a memory is generally generated by supplying a current through a conductor. Especially in a memory used in a portable terminal, supply of a large current is undesirably flowed under restrictions on the power supply capacity. Thus, a conductor for generating a magnetic field must be wound around a memory element formed from a magnetoresistive film. This measure complicates a structure or electrical circuit around the magnetoresistive film, and is difficult to form. This results in low yield and very high cost.

The present invention has been made in consideration of the above situation, and has as its object to provide a magnetoresistive film which reduces the switching field of a perpendicular magnetization film and is easy to form without decreasing the yield or greatly increasing the cost, and a memory requiring only small power consumption.

SUMMARY OF THE INVENTION

The above object is achieved by a magnetoresistive film comprising a nonmagnetic film, and a structure in which magnetic films are formed on two sides of the nonmagnetic film, wherein at least one of the magnetic films includes a perpendicular magnetization film, and a magnetic film whose easy axis of magnetization is inclined from a direction perpendicular to a film surface is formed at a position where the magnetic film contacts the perpendicular magnetization film but does not contact the nonmagnetic film.

The above object is also achieved by a memory having a memory element with the magnetoresistive film, comprising means for applying a magnetic field to the magnetoresistive film in a direction perpendicular to a film surface, and means for detecting a resistance of the magnetoresistive film.

The above object is also achieved by the memory wherein a plurality of magnetoresistive films are arranged, and the memory further comprises means for selectively recording information on a desired magnetoresistive film, and means for selectively reading out information recorded on a desired magnetoresistive film.

BRIEF DESCRIPTION OF THE DRAWINGS

FIGS. 14A, 14B, 14C and 14D are views for explaining a recording/reproduction principle in a conventional magnetoresistive film using an in-plane magnetization film, in which FIG. 14A is a schematic sectional view showing a magnetization state when recorded information "1" is read out, FIG. 14B is a schematic sectional view showing a magnetization state when recorded information "0" is read out, FIG. 14C is a schematic sectional view showing a magnetization state when recorded information "1" is read out, and FIG. 14D is a schematic sectional view showing a magnetization state when recorded information "0" is read out;

FIGS. 15A, 15B, 15C and 15D are views for explaining a recording/reproduction principle in a conventional magnetoresistive film using a perpendicular magnetization film, in which FIG. 15A is a schematic sectional view showing a magnetization state when recorded information "1" is read out, FIG. 15B is a schematic sectional view showing a magnetization state when recorded information "0" is read out, FIG. 15C is a schematic sectional view showing a magnetization state when recorded information "1" is read out, and FIG. 15D is a schematic sectional view showing a magnetization state when recorded information "0" is read out;

DETAILED DESCRIPTION OF THE PREFERRED EMBODIMENTS

Figure 1:
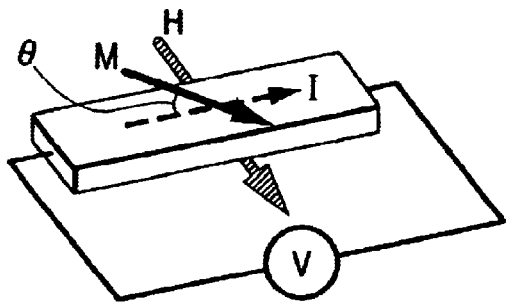
FIG. 1 is a schematic sectional view showing a magnetoresistive film according to the present invention.

FIG. 1 shows an example of a magnetoresistive film according to the present invention. A magnetic film whose magnetization orients itself in a direction inclined from a direction perpendicular to the film surface in the absence of a magnetic field while no exchange force with another magnetic substance acts, i.e., a first magnetic film 111 whose easy axis of magnetization inclines from the direction perpendicular to the film surface, a second magnetic film 112 serving as a perpendicular magnetization film, a nonmagnetic film 113, and a third magnetic film 114 serving as a perpendicular magnetization film are sequentially formed. The first and second magnetic films 111 and 112 are exchange-coupled. The magnetization of the second magnetic film 112 is adjusted to orient in a direction perpendicular to the film surface at least around the interface between the second magnetic film 112 and the nonmagnetic film 113 in the absence of a magnetic field, or to orient in the direction perpendicular to the film surface upon application of a magnetic field in this direction. In an MRAM, the intensity of a magnetic field applicable to a memory element is preferably set to 4 kA/m or less under restrictions on the current density flowing through a conductor. From this, the magnetization inclined from the direction perpendicular to the film surface in the absence of a magnetic field is oriented in the perpendicular direction by applying a magnetic field of 4 kA/m or less. If a perpendicular magnetization film is exchange-coupled with a magnetic film whose magnetization orients in a direction inclined from the direction perpendicular to the film surface in the absence of a magnetic field while no exchange force with another magnetic substance acts, the perpendicular magnetic anisotropy of the perpendicular magnetization film apparently decreases. Hence, the switching field in the direction perpendicular to the film surface can be reduced.

To further increase the MR ratio, a structure in which a high-spin-polarization layer is inserted between nonmagnetic and magnetic layers has conventionally been examined. To the contrary, the present invention is to decrease a switching field with respect to a magnetic field applied in a direction perpendicular to the film surface. A magnetic film whose magnetization orients in a direction inclined from the direction perpendicular to the film surface in the absence of a magnetic field while no exchange force with another magnetic substance acts does not contact a nonmagnetic film, in other words, is not inserted between magnetic and nonmagnetic layers. This magnetic film does not directly concern the development of the MR effect, and its magnetization need not orient in the direction perpendicular to the film surface.

Even if a magnetic film whose magnetization orients in a direction inclined from the direction perpendicular to the film surface in the absence of a magnetic field while no exchange force with another magnetic substance acts is so formed as not to contact a nonmagnetic film, the switching field of an exchange coupling film between the magnetic film and a perpendicular magnetization film becomes smaller than that of the single-layer of a perpendicular magnetization film. Magnetization switching in the direction perpendicular to the film surface depends on the film thickness of the magnetic film whose magnetization orients in a direction inclined from the direction perpendicular to the film surface. The film thickness of the magnetic film is determined by the intensity of a switching field. In a magnetoresistive film according to the present invention, the magnetization of the magnetic film whose magnetization orients in a direction inclined from the direction perpendicular to the film surface need not be oriented in the direction perpendicular to the film surface. This magnetic film can be made relatively thick, and the switching field in the direction perpendicular to the film surface can be easily sufficiently reduced.

As described above, main examples of the perpendicular magnetization film are an alloy film or artificial lattice film made of at least one element selected from the group consisting of rear-earth metals such as Gd, Dy, and Tb and at least one element selected from the group consisting of transition metals such as Co, Fe, and Ni, an artificial lattice film made of a transition metal and noble metal such as Co/Pt, and an alloy film having crystallomagnetic anisotropy in a direction perpendicular to the film surface, such as CoCr. The magnetic film whose magnetization orients in a direction inclined from the direction perpendicular to the film surface in the absence of a magnetic field while no exchange force with another magnetic substance acts can be obtained by adjusting film formation conditions so as to satisfy $Ku-2\pi Ms^2<0$ by using the same materials as that of the magnetic film having perpendicular magnetic anisotropy. This provides a magnetic film whose easy axis of magnetization inclines from the direction perpendicular to the film surface. In this case, Ku is the energy constant of perpendicular magnetic anisotropy, and Ms is the intensity of saturation magnetization. The use of a rare earth-transition metal alloy preferably allows easily controlling these physical properties. A film made of one element selected from the group consisting of transition metals such as Co, Fe, and Ni, or an in-plane magnetization film formed from an alloy film made of two or more elements is also usable.

Examples of the nonmagnetic film 113 are a conductor such as Cu or Cr, and an insulator such as $Al_2O_3$ or NiO. The nonmagnetic film 113 made of an insulator provides a relatively large magnetoresistance change, and is preferably used for a memory element.

When a magnetoresistive film having the film structure shown in FIG. 1 is used as a memory element, the magnetization of the second magnetic film 112 can be switched by an applied magnetic field, and the magnetization of the third magnetic film 114 can or cannot be switched. If the magnetization of the third magnetic film 114 cannot be switched, the element voltage is preferably directly read without changing the magnetization direction in order not to destruct recorded information in read. If the magnetization of the third magnetic film 114 can be switched, the exchange coupling film between the first and second magnetic films 111 and 112 with a relatively small switching field (coercive force) can be set as a read-out layer, and the magnetic layer 114 with a relatively large switching field (coercive force) can be set as a recording layer. Recorded information can be read out in an nondestructive manner by reading an element voltage change caused by switching the magnetization direction of the second magnetic film 112.

Figure 2:
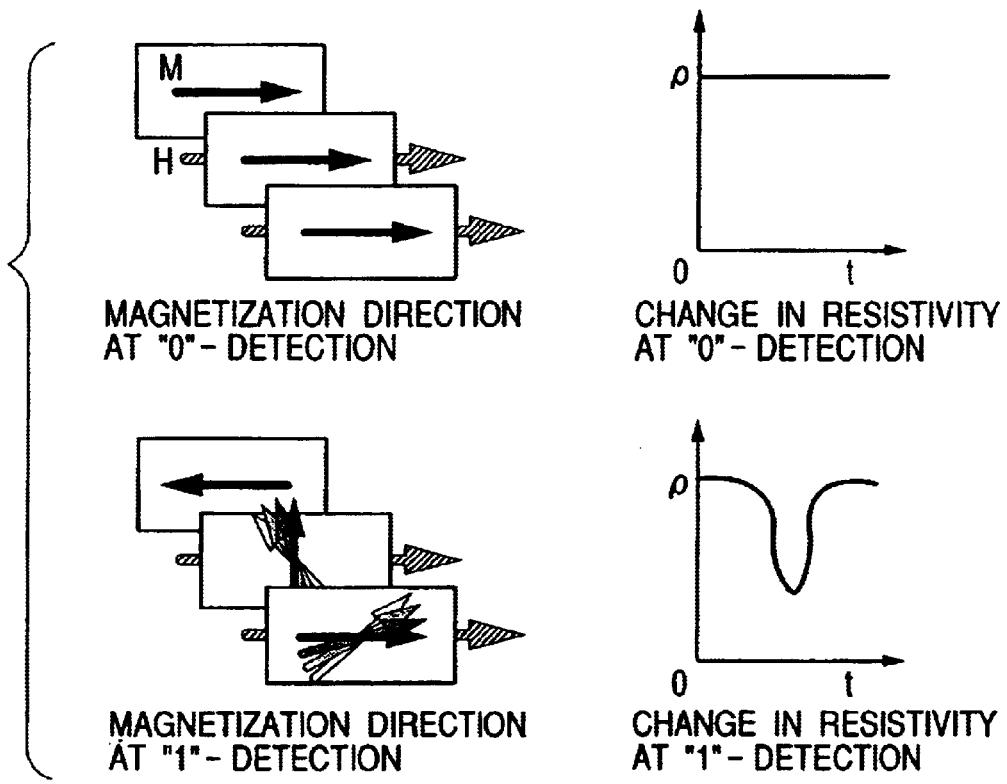
FIG. 2 is a schematic sectional view showing another magnetoresistive film according to the present invention.

FIG. 2 is a schematic sectional view showing a film structure as an example of the embodiment of the present invention. This film structure is different from that shown in FIG. 1 in that a fourth magnetic film 115 is formed. The fourth magnetic film 115 is a magnetic film whose magnetization orients in a direction inclined from the direction perpendicular to the film surface in the absence of a magnetic field while no exchange force with another magnetic substance acts. The fourth magnetic film 115 is exchange-coupled to the third magnetic film 114. The fourth magnetic film 115 reduces the switching field of a perpendicular magnetization film, similar to the first magnetic film 111. This structure enables switching the magnetizations of both the second and third magnetic films 112 and 114 by a small application magnetic field. The switching field of the second magnetic film 112 and that of the third magnetic film 114 are different in intensity. When a magnetoresistive film having this structure is used as a memory, one layer having a relatively small switching field out of the exchange coupling film between the first and second magnetic films 111 and 112 and the exchange coupling film between the third and fourth magnetic films 114 and 115 is set as a read-out layer, and the other layer having a relatively large switching field is set as a recording layer. The intensity of the switching field can be adjusted by the composition, film thickness, or film formation conditions of each magnetic film.

Figure 3:
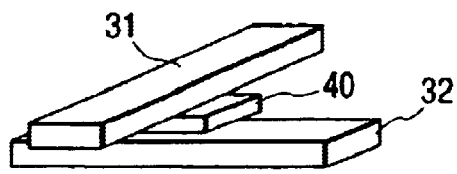
FIG. 3 is a schematic sectional view showing still another magnetoresistive film according to the present invention.

Also, as shown in FIG. 3, magnetic films 116 and 117 made of a material having a high spin polarization can be formed at interfaces between the nonmagnetic film 113 and these magnetic films, thus increasing the magnetoresistance ratio. These films are formed at the two interfaces in FIG. 3, but only one of them may be formed. The magnetic films 116 and 117 formed at the interfaces may be magnetic films whose magnetizations orient in a direction inclined from the direction perpendicular to the film surface, or perpendicular magnetization films. While the second and third magnetic films 112 and 114 are exchange-coupled to each other, the magnetization around the interface with the nonmagnetic film 113 must be perpendicular to the film surface.

The magnetic films 116 and 117 may have a grain shape.

In the magnetoresistive film of the present invention, the nonmagnetic film may be made of a metal such as Cu or a dielectric such as $Al_2O_3$. When the magnetoresistive film is used as a memory, a dielectric nonmagnetic film is preferable because of a large magnetoresistance change.

A plurality of magnetoresistive films having any one of the above-described film structures are laid out to constitute a memory on which information can be selectively recorded by applying a relatively large magnetic field to only one desired element.

The switching field (coercive force) can be reduced by transforming some or all of magnetic layers and intentionally forming a portion where the magnetic anisotropy is small. Details will be explained in the following embodiments.

(First Embodiment)

Figure 4:
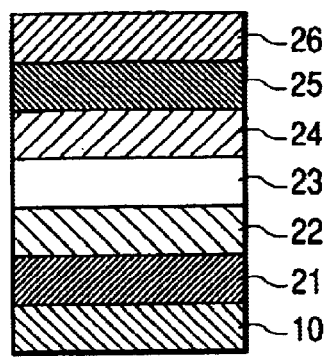
FIG. 4 is a schematic sectional view showing a magnetoresistive film used in the first embodiment.

FIG. 4 is a schematic sectional view showing a magnetoresistive film according to the first embodiment. An Si wafer was used as a substrate 001, and its surface was oxidized to form an $SiO_2$ film 002 having a thickness of about 1 μm. A 5-nm thick Fe film which is an in-plane magnetization film serving as a first magnetic film 111, a 30-nm thick $Gd_{20}Fe_{80}$ film which is a perpendicular magnetization film serving as a second magnetic film 112, a 2-nm thick $Al_2O_3$ film serving as a nonmagnetic film 113, a 10-nm thick $Tb_{22}Fe_{78}$ film which is a perpendicular magnetization film serving as a third magnetic film 114, and a 5-nm thick Pt film serving as a protective film 118 were sequentially formed on the $SiO_2$ film 002. The Fe and $Gd_{20}Fe_{80}$ films were exchange-coupled to each other, and the Pt film functioned as a protective film for preventing corrosion such as oxidization of a magnetic film. In both the $Gd_{20}Fe_{80}$ and $Tb_{22}Fe_{78}$ films, the sub-lattice magnetizations of transition metals were dominant. A 1-μm☐ resist film was formed on the obtained multilayered film, and the Pt and $Tb_{22}Fe_{78}$ films were removed by dry etching from a portion not covered with the resist. After etching, a 15-nm thick $Al_2O_3$ film was formed, and the resist and upper $Al_2O_3$ film were removed. An insulating film 121 for preventing short-circuiting between an upper electrode and the lower electrode made up of the Fe and $Gd_{20}Fe_{80}$ films was formed. After that, an upper electrode 122 was formed from an Al film by lift-off, and the $Al_2O_3$ film shifted from the upper electrode was removed to form an electrode pad for connecting a measurement circuit. A magnetic field of 2 MA/m was applied to the resultant magnetoresistive film in a direction perpendicular to the film surface to magnetize the $Tb_{22}Fe_{78}$ film toward the applied magnetic field. The coercive force of the 1-cm☐ $Tb_{22}Fe_{78}$ film exhibited a value as large as 1.6 MA/m. The coercive force of the resultant magnetoresistive film is also expected to exhibit a similarly large value.

Figure 5:
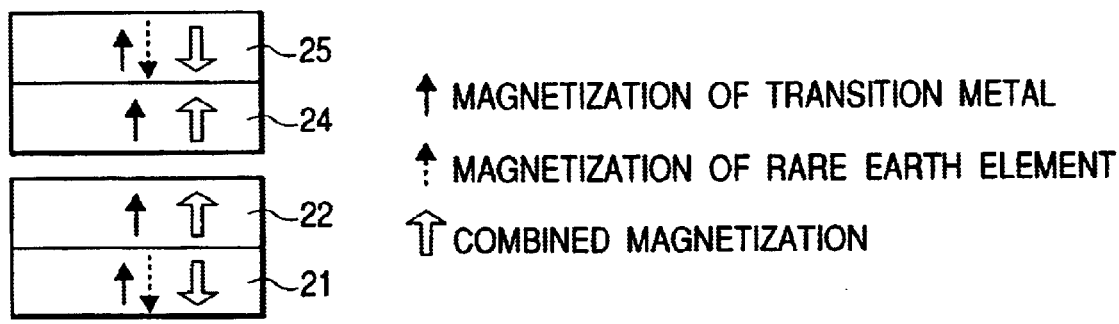
FIG. 5 is a graph showing the magnetoresistance curve of the magnetoresistive film used in the first embodiment.

The upper and lower electrodes of the magnetoresistive film were connected to a constant current source, and a constant current was so flowed as to make electrons tunnel through the $Al_2O_3$ film between the $Gd_{20}Fe_{80}$ film and the $Tb_{22}Fe_{78}$ film. A magnetic field was applied perpendicularly to the film surface of the magnetoresistive film, and the intensity and direction were changed to measure voltage changes (magnetoresistance curve) in the magnetoresistive film. The results are shown in FIG. 5. According to the measurement results, magnetization switching occurred at about 3 kA/m.

(Second Embodiment)

Figure 6:
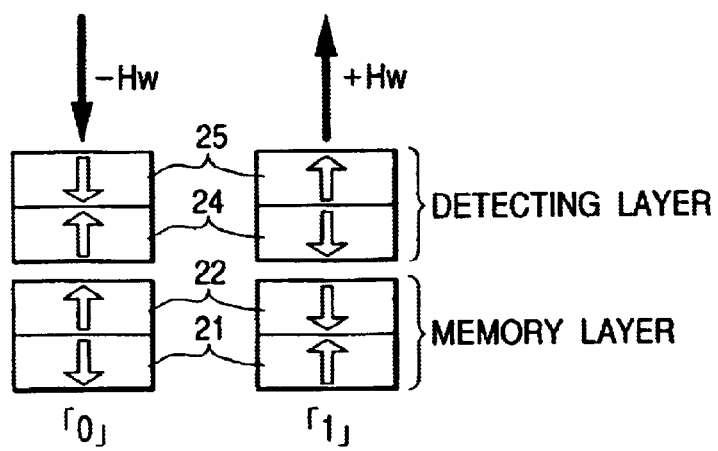
FIG. 6 is a schematic sectional view showing a magnetoresistive film used in the second embodiment.

FIG. 6 is a schematic sectional view showing a magnetoresistive film according to the second embodiment. An Si wafer was used as a substrate 001, and its surface was oxidized to form an $SiO_2$ film 002 having a thickness of about 1 μm. A 3-nm thick Fe film which is an in-plane magnetization film serving as a first magnetic film 111, a 50-nm thick $Gd_{25}Fe_{75}$ film which is a perpendicular magnetization film serving as a second magnetic film 112, a 1-nm thick $Co_{50}Fe_{50}$ film which is an in-plane magnetization film serving as a magnetic film 116 exhibiting a higher spin polarization than that of the second magnetic film, a 2-nm thick $Al_2O_3$ film serving as a nonmagnetic film 113, a 1-nm thick $Co_{50}Fe_{50}$ film which is an in-plane magnetization film serving as a magnetic film 117 exhibiting a higher spin polarization than that of the third magnetic film, a 30-nm thick $Tb_{25}Fe_{75}$ film which is a perpendicular magnetization film serving as a third magnetic film 114, a 3-nm thick Fe film which is an in-plane magnetization film serving as a fourth magnetic film 115, and a 5-nm thick Pt film serving as a protective film 118 were sequentially formed on the $SiO_2$ film 002. The Fe and $Gd_{25}Fe_{75}$ films, and the $Gd_{25}Fe_{75}$ and $Co_{50}Fe_{50}$ films were respectively exchange-coupled to each other. The $Co_{50}Fe_{50}$ and $Tb_{25}Fe_{75}$ films, and the $Tb_{25}Fe_{75}$ and Fe films were respectively exchange-coupled to each other. In both the $Gd_{25}Fe_{75}$ and $Tb_{25}Fe_{75}$ films, the sub-lattice magnetizations of rear-earth metals were dominant. The two-layered $Co_{50}Fe_{50}$ film had a higher spin polarization than those of the $Gd_{25}Fe_{75}$ and $Tb_{25}Fe_{75}$ films, and was magnetized in the direction perpendicular to the film surface by the exchange coupling force. The Pt film functioned as a protective film for preventing corrosion such as oxidization of a magnetic film. A 1-μm☐ resist film was formed on the obtained multilayered film, and the Pt and $Tb_{25}Fe_{75}$ films were removed by dry etching from a portion not covered with the resist. After etching, a 39-nm thick $Al_2O_3$ film was formed, and the resist and upper $Al_2O_3$ film were removed. An insulating film 121 for preventing short-circuiting between an upper electrode and the lower electrode made up of the Fe and $Gd_{25}Fe_{75}$ films was formed. Then, an upper electrode 122 was formed from an Al film by lift-off, and the $Al_2O_3$ film shifted from the upper electrode was removed to form an electrode pad for connecting a measurement circuit.

Figure 7:
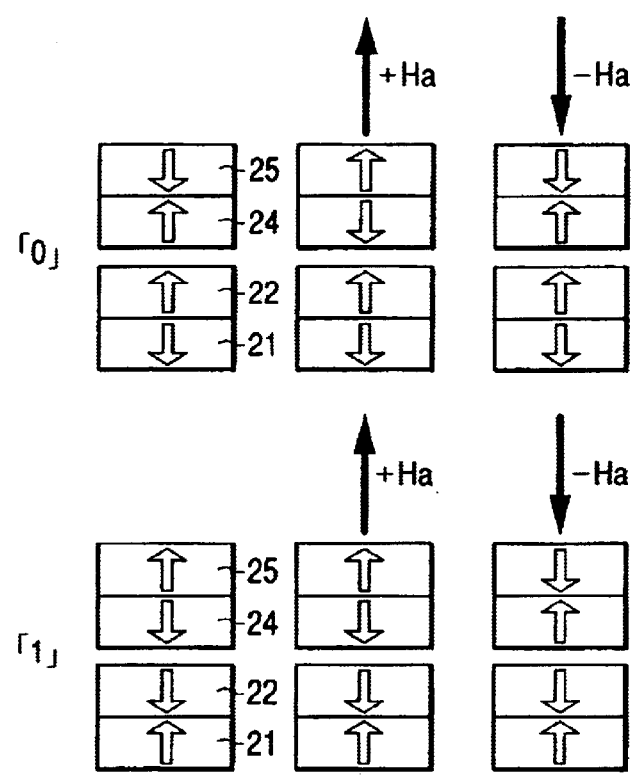
FIG. 7 is a graph showing the magnetoresistance curve of the magnetoresistive film used in the second embodiment.

The upper and lower electrodes of the magnetoresistive film were connected to a constant current source, and a constant current was so flowed as to make electrons tunnel through the $Al_2O_3$ film between the $Gd_{25}Fe_{75}$ film and the $Tb_{25}Fe_{75}$ film. A magnetic field was applied perpendicularly to the film surface of the magnetoresistive film, and the intensity and direction were changed to measure voltage changes in the magnetoresistive film. The results are shown in FIG. 7. Magnetization switching occurred at about 2.5 kA/m and 3.8 kA/m.

(Third Embodiment)

Figure 8:
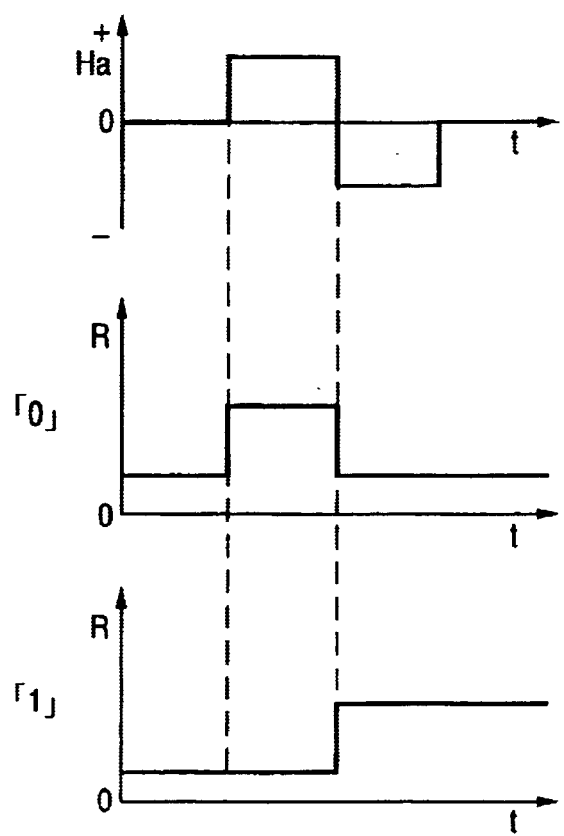
FIG. 8 is a circuit diagram showing an electrical circuit for applying a magnetic field to a magnetoresistive film used for a memory in the third embodiment.
Figure 9:
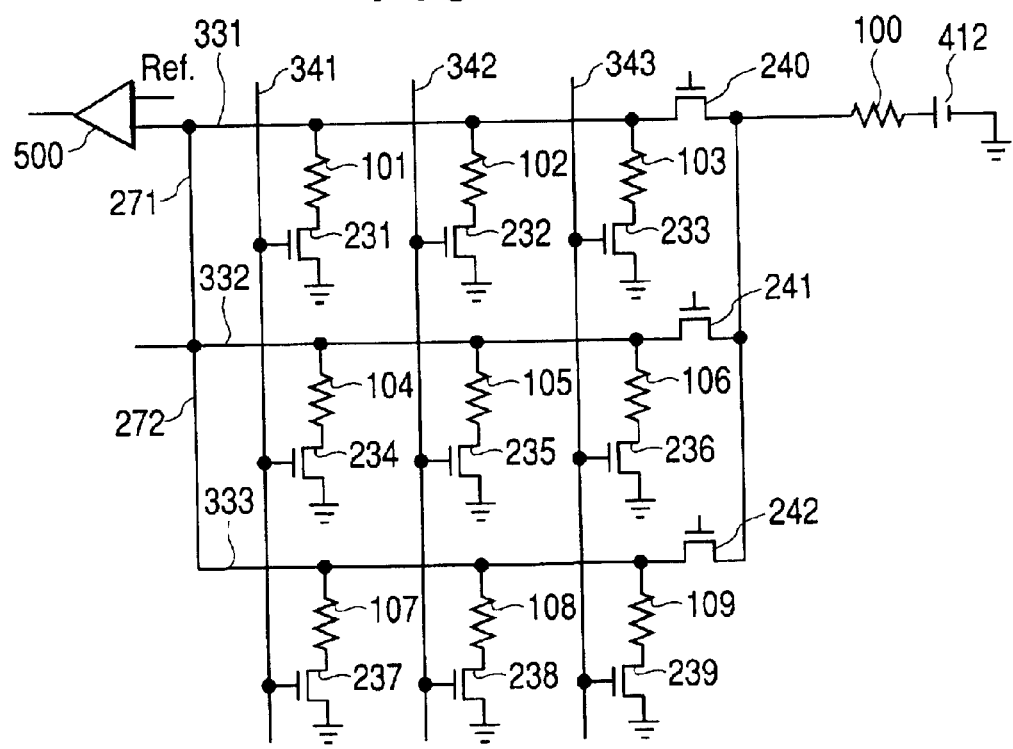
FIG. 9 is a circuit diagram showing a read circuit used for the memory in the third embodiment.

FIGS. 8 and 9 show the electrical circuit of a memory cell when magnetoresistive films 101 to 109 adopted in the second embodiment were laid out in a 3×3 array as memory elements. FIG. 8 shows a circuit for generating a magnetic field to be applied to the magnetoresistive film. FIG. 9 shows a circuit for detecting a resistance change in the magnetoresistive film.

A method of selectively switching the magnetization of the magnetic film of an arbitrary element will be explained. For example, to selectively switch the magnetization of the magnetoresistive film 105, transistors 212, 217, 225, and 220 are turned on, and the remaining transistors are kept off. Then, a current flows through conductors 312, 313, 323, and 322 to generate magnetic fields around them. The magnetic fields in the same direction are applied from the four conductors to only the magnetoresistive film 105. The combined magnetic field is so adjusted as to be slightly larger than the switching field of the magnetic film of the element. Only the magnetization of the magnetoresistive film 105 can be selectively switched. To apply a magnetic field in a vertically opposite direction to the magnetoresistive film 105, transistors 213, 216, 224, and 221 are turned on, and the remaining transistors are kept off. Then, a current flows through the conductors 312, 313, 323, and 322 in a direction opposite to the previous direction, and an opposite magnetic field is applied to the magnetoresistive film 105.

Read operation will be explained. For example, to read out information recorded on the magnetoresistive film 105, transistors 235 and 241 are turned on to form a circuit in which a power supply 412, a fixed resistor 100, and the magnetoresistive film 105 are series-connected. The power supply voltage is divided into resistances at the ratio between the resistance value of the fixed resistor 100 and that of the magnetoresistive film 105. Since the power supply voltage is fixed, the voltage applied to the magnetoresistive film changes depending on a change in the resistance value of the magnetoresistive film. This voltage value is read out by a sense amplifier 500. The read method includes mainly two methods. First, the magnitude of the voltage value applied to the magnetoresistive film is detected, and information is identified by the magnitude. This is called absolute detection. Second, only the magnetization direction of the read-out layer of the magnetoresistive film is changed, and information is identified by the difference in voltage change. For example, when the magnetization of the read-out layer is switched, a change upon a decrease in voltage value is defined as "1", and a change upon an increase in voltage value is defined as "0". This read method is called relative detection.

Figure 10:
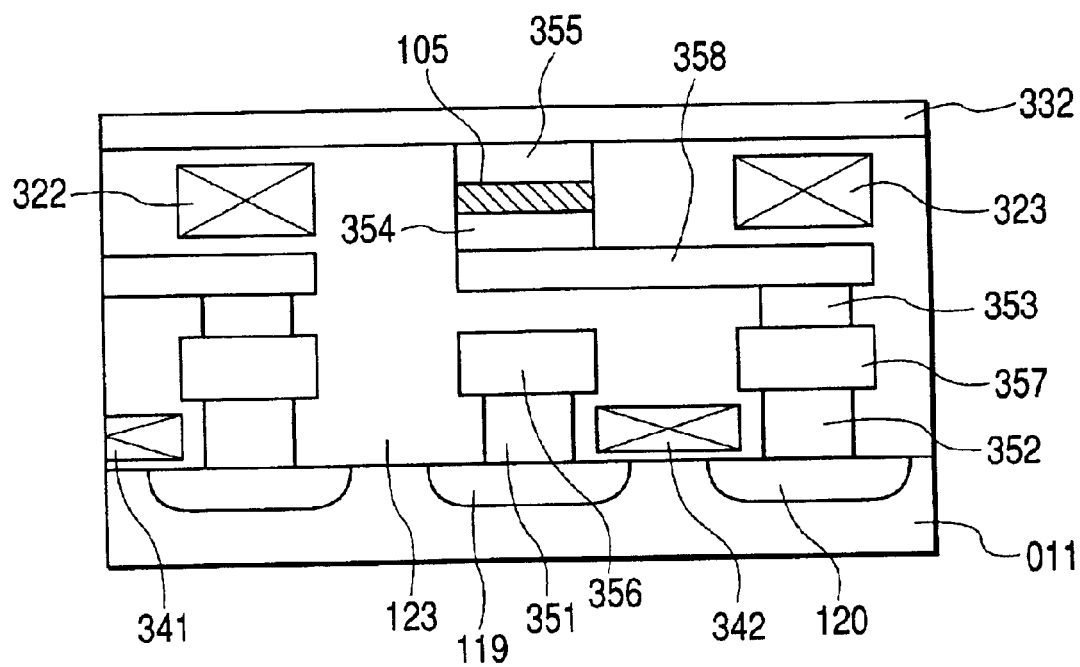
FIG. 10 is a schematic sectional view showing part of the memory in the third embodiment.

FIG. 10 is a schematic sectional view showing a peripheral portion around one element. Two n-type diffusion regions 119 and 120 are formed in a p-type Si substrate 011, and a word line (gate electrode) 342 is formed between them via an insulating layer 123. A ground wire 356 is connected to the n-type diffusion region 119. A magnetoresistive film 105 is connected to the other n-type diffusion region via contact plugs 352, 353, 354, and 357 and a local wire 358. The magnetoresistive film is further connected to a bit line 332. Conductors 322 and 323 for generating a magnetic field are formed beside the magnetoresistive film 105.

(Comparative Example)

Figure 11:
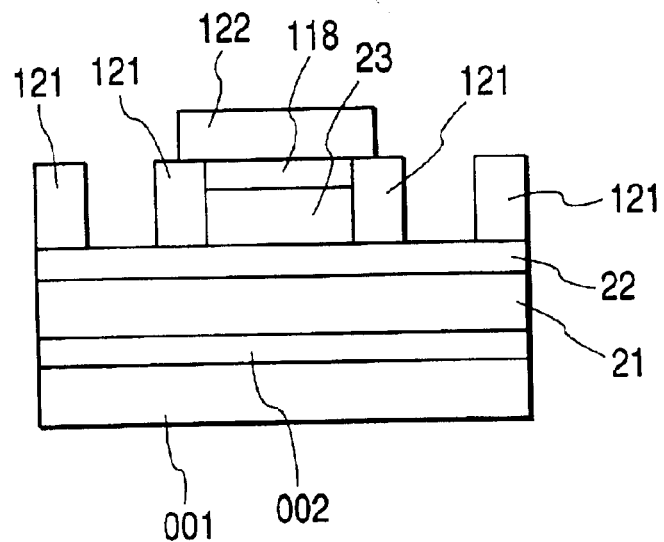
FIG. 11 is a schematic sectional view showing a magnetoresistive film used in a comparative example.

In FIG. 11, an Si wafer was used as a substrate 001, and its surface was oxidized to form an $SiO_2$ film 002 having a thickness of about 1 μm. A 30-nm thick $Gd_{20}Fe_{80}$ film which is a perpendicular magnetization film serving as a magnetic film 21 having a relatively small switching field, a 2-nm thick $Al_2O_3$ film serving as a nonmagnetic film 22, a 10-nm thick $Tb_{22}Fe_{78}$ film which is a perpendicular magnetization film serving as a magnetic film 23 having a relatively large coercive force, and a 5-nm Pt film serving as a protective film 118 were sequentially formed on the $SiO_2$ film 002. The Pt film functioned as a protective film for preventing corrosion such as oxidization of a magnetic film. In both the $Gd_{20}Fe_{80}$ and $Tb_{22}Fe_{78}$ films, the sub-lattice magnetizations of transition metals were dominant. A 1-μm□ resist film was formed on the obtained multilayered film, and the Pt and $Tb_{22}Fe_{78}$ films were removed by dry etching from a portion not covered with the resist. After etching, a 15-nm thick $Al_2O_3$ film was formed, and the resist and upper $Al_2O_3$ film were removed. An insulating film 121 for preventing short-circuiting between an upper electrode and the lower electrode formed from the $Gd_{20}Fe_{80}$ film was formed. After that, an upper electrode 122 was formed from an Al film by lift-off, and the $Al_2O_3$ film shifted from the upper electrode was removed to form an electrode pad for connecting a measurement circuit. A magnetic field of 2 MA/m was applied to the resultant magnetoresistive film in a direction perpendicular to the film surface to magnetize the $Tb_{22}Fe_{78}$ film toward the applied magnetic field. The coercive force of the 1-cm□ $Tb_{22}Fe_{78}$ film exhibited a value as large as 1.6 MA/m. The coercive force of the resultant magnetoresistive film is also expected to exhibit a similarly large value.

Figure 12:
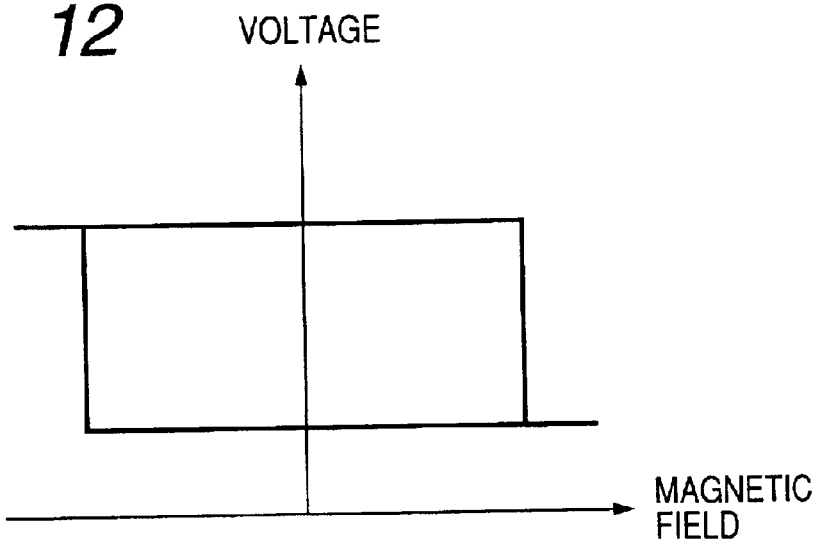
FIG. 12 is a graph showing the magnetoresistance curve of the magnetoresistive film used in the comparative example.
Figure 13A:
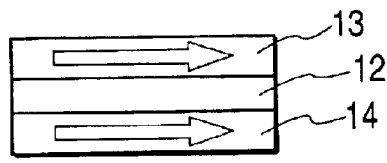
FIG. 13A is a schematic sectional view showing a state in which the magnetizations of the magnetoresistive film are parallel.
Figure 13B:
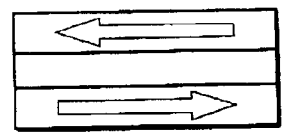
FIG. 13B is a schematic sectional view showing a state in which the magnetizations of the magnetoresistive film are antiparallel.
Figure 14A:
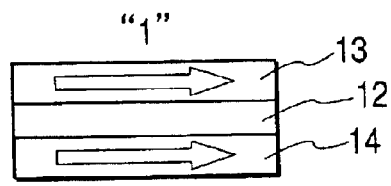
Figure 14B:
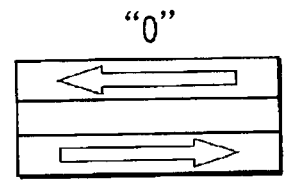
Figure 14C:
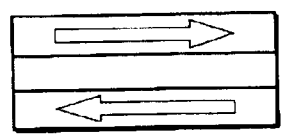
Figure 14D:
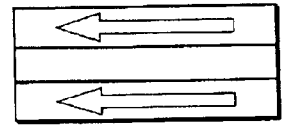
Figure 15A:
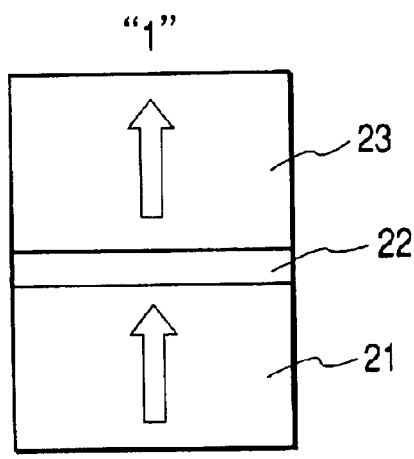
Figure 15B:
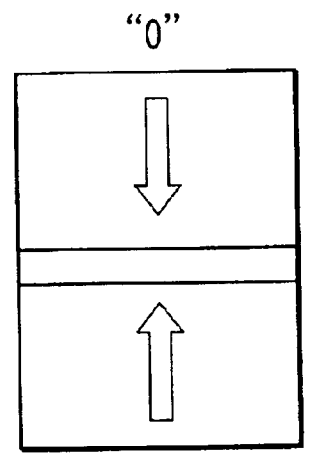
Figure 15C:
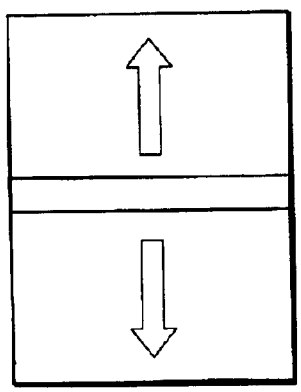
Figure 15D:
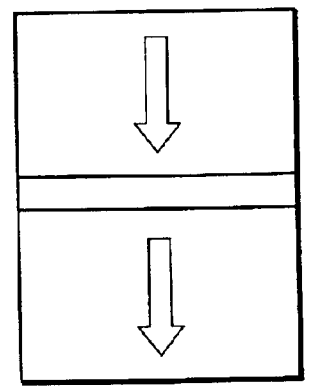

The upper and lower electrodes of the magnetoresistive film were connected to a constant current source, and a constant current was so flowed as to make electrons tunnel through the $Al_2O_3$ film between the $Gd_{20}Fe_{80}$ film and the $Tb_{22}Fe_{78}$ film. A magnetic field was applied perpendicularly to the film surface of the magnetoresistive film, and the intensity and direction were changed to measure voltage changes (magnetoresistance curve) in the magnetoresistive film. The results are shown in FIG. 12. According to the measurement results, a switching field was about 24 kA/m.

(Fourth Embodiment)

In the above embodiments, a magnetic layer (layer with small perpendicular magnetic anisotropy) whose magnetization inclines in the direction of film thickness (stacking direction) is formed for a magnetic layer for reducing a switching field. The magnetization-inclined magnetic layer can be formed on the side surface of the magnetic layer for reducing a switching field.

Figure 16A:
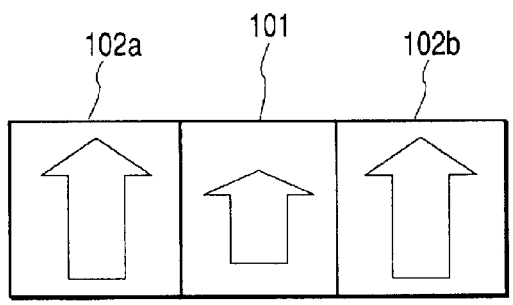
FIGS. 16A, 16B, 16C and 16D are schematic sectional views showing changes in the magnetization of a magnetic film in the fifth embodiment.

This will be described with reference to FIGS. 16A to 16D. FIGS. 16A to 16D are schematic sectional views showing changes in the magnetization direction of each magnetic layer in a structure in which a region (layer) with small perpendicular magnetic anisotropy is formed on the side surface of a magnetic layer. For descriptive convenience, only a magnetic film having a small perpendicular magnetic anisotropy layer is illustrated. Such a magnetic film can also be adopted as the magnetic film of a magnetoresistive element. FIGS. 16A to 16D show, in time series, states in which the magnetization direction of a first magnetic layer 101 and that of second magnetic region 102 exhibiting smaller perpendicular magnetic anisotropy coincide with each other, the magnetizations are switched by applying an external magnetic field, and the magnetization directions finally coincide with each other in an opposite direction. In FIG. 16A, arrows are vectors representing the magnetization directions of the first magnetic layer 101 and second magnetic region 102.

This is a simple model for briefly explaining the mechanism of the present invention. Needless to say, an actual magnetization switching behavior is a microscopic, complicated reaction based on micromagnetics.

In the state of FIG. 16A, the magnetization of the first magnetic layer 101 and those of first magnetic regions 102a and 102b are upward. As a downward external magnetic field applied to the magnetic films gradually becomes stronger, the magnetization directions of the second magnetic layers 102a and 102b with small perpendicular magnetic anisotropy start inclining, as shown in FIG. 16B.

Figure 16B:
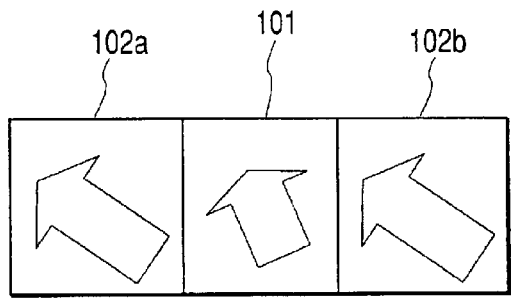

In the state of FIG. 16B, the intensity of the external magnetic field is smaller than the coercive force of the first magnetic layer 101. The first magnetic layer 101 receives exchange forces from the peripheral second magnetic regions 102a and 102b, and the magnetization of the first magnetic layer 101 is more easy to switch than a single-layered structure. Thus, the magnetization direction of the first magnetic layer 101 also inclines. However, the inclination of the first magnetic layer 101 is smaller than those of the second magnetic regions 102a and 102b.

Figure 16C:
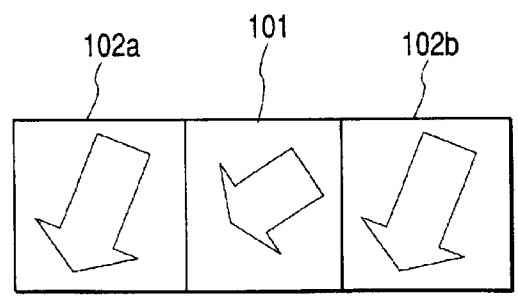

In the state of FIG. 16C, the downward external magnetic field becomes stronger than in the state of FIG. 16B. The magnetizations of the second magnetic regions 102a and 102b with small perpendicular magnetic anisotropy are almost completely switched. However, the magnetization of the first magnetic layer 101 is switched with a delay.

Figure 16D:
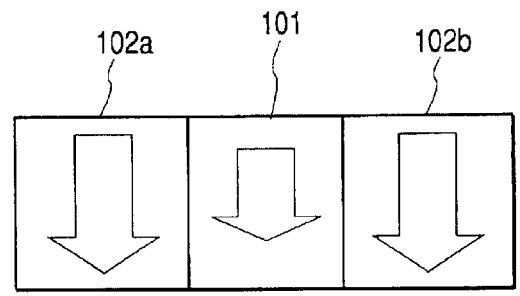

In the state of FIG. 16D, the external magnetic field becomes much stronger than the state of FIG. 16C. The magnetization of the first magnetic layer 101 and those of the first magnetic regions 102a and 102b are completely switched. In this way, the magnetization is switched by a small external magnetic field in comparison with the use of the single first magnetic layer 101.

Applying the magnetic film of this embodiment to an MRAM can easily reduce the switching field of a memory cell and can reduce a write current necessary for magnetization switching.

Figure 17A:
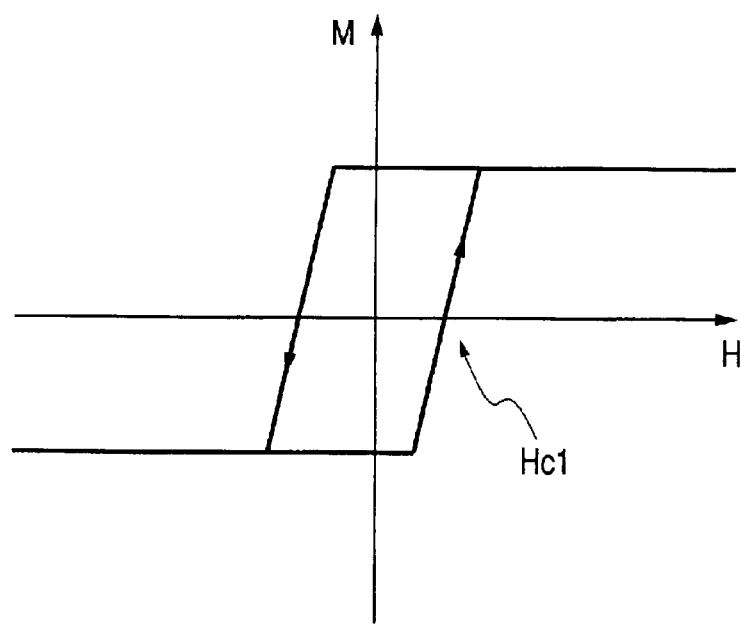
FIGS. 17A and 17B are graphs showing the magnetization curve of the magnetic film in the fifth embodiment, and the magnetization curve of a single first magnetic layer 101, respectively.
Figure 17B:
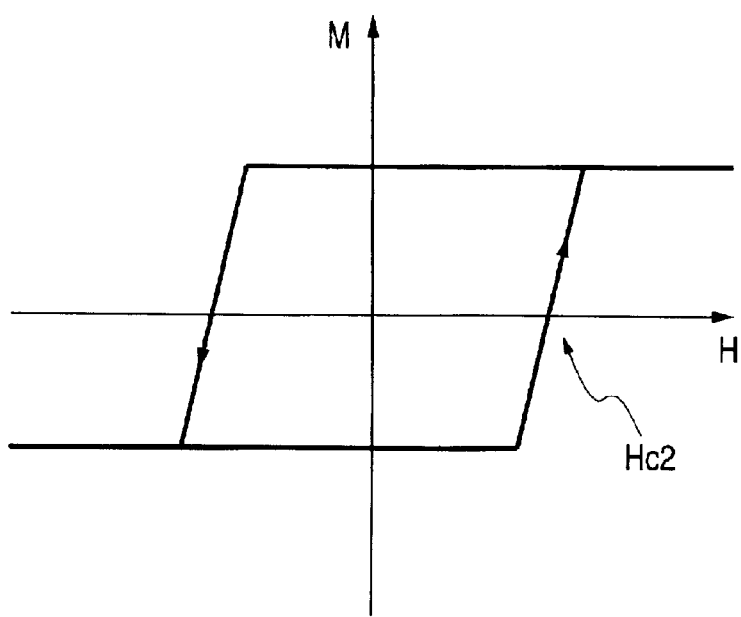

FIG. 17A is a graph showing the magnetization curve of a magnetic element according to the fourth embodiment, and FIG. 17B is a graph showing the magnetization curve of the single first magnetic layer 101. The magnetization curve is a graph representing the relationship between an external magnetic field (H) and the magnetization. Each arrow in FIGS. 17A and 17B represents the magnetization progress direction at a portion where the magnetization curve exhibits a hysteresis characteristic. In this case, an external magnetic field at a point where the magnetization curve crosses the H axis is defined as a coercive force. The coercive force of the magnetic element in the fourth embodiment is Hc1, and that of the single first magnetic layer 101 is Hc2.

The coercive forces Hc1 and Hc2 have a relation: Hc1<Hc2. The magnetization is switched by a weak external magnetic field, compared to the single magnetic layer 101.

Figure 18A:
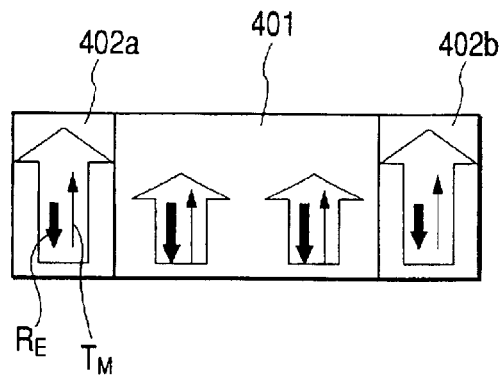
FIGS. 18A and 18B are schematic views showing the magnetization of a magnetic element using a perpendicular magnetization film made of an alloy of a rear-earth metal and transition metal.
Figure 18B:
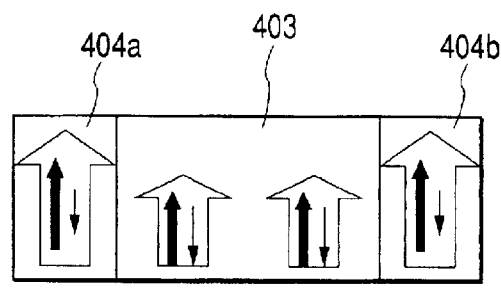

FIGS. 18A and 18B are schematic views showing the magnetization of a structure in which a ferrimagnet as an alloy of a rear-earth metal and transition metal is used for a magnetic film. FIG. 18A shows the magnetization when the transition metal is dominant, and FIG. 18B shows the magnetization when the rear-earth metal is dominant. Each thick arrow represents the magnetization direction of the rear-earth metal (RE), each thin arrow represents the magnetization direction of the transition metal (TM), and each thick open arrow represents the combined magnetization direction.

A rare earth metal-transition metal magnetic substance combined with proper materials and composition exhibits ferrimagnetism. Hence, the magnetizations of the rear-earth metal and transition metal are antiparallel. The difference between the rear-earth metal sub-lattice magnetization and the transition metal sub-lattice magnetization is observed as the entire magnetization.

The above description describes a method wherein a smaller perpendicular magnetic anisotropy region is provided to reduce the magnetic field inverting the magnetization. Also, another method wherein a region of larger magnetization is provided may be used to reduce the switching field.

For example, a first magnetic layer 401 containing transition metal and rear-earth metal is provided, such that the magnetization of the transition metal is larger than that of the rear-earth metal, but their difference is small. And, the first magnetic regions 402a and 402b containing the transition metal and rear-earth metal, such that the magnetization of the transition metal is much larger than that of the rear-earth metal. The entire magnetization of the first magnetic regions 402a and 402b is larger than that of the first magnetic layer 401.

The first magnetic regions 402a and 402b with large magnetization, or small perpendicular magnetic anisotropy are switched in magnetization by a weaker external magnetic field in comparison with the first magnetic-layer 401.

In FIG. 18B, both a first magnetic layer 403 and first magnetic region 404 are made of an alloy in which the sub-lattice magnetizations of rear-earth metals are dominant.

First magnetic regions 404a and 404b with large magnetization, or small perpendicular magnetic anisotropy are switched in magnetization by a weaker external magnetic field in comparison with the first magnetic layer 403.

FIGS. 18A and 18B show the case wherein the dominant metals of the first magnetic layer and first magnetic region are of the same kind. It is also possible that a sub-lattice magnetization of rear-earth metal is dominant in either one of the first magnetic layer and first magnetic region and a sub-lattice magnetization of transition metal is dominant in the other as far as the magnetization of the entire first magnetic layer is larger than that of the entire first magnetic region and their directions are the same.

A manufacturing method will be explained. There are many manufacturing methods for the magnetic film in the fourth embodiment. For example, the first magnetic layer is transformed to obtain the first magnetic region, or the first magnetic region is patterned by photolithography to form a film.

Figure 19A:
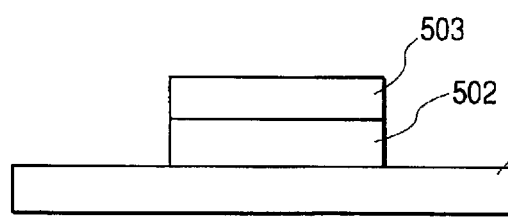
FIGS. 19A, 19B and 19C are schematic views for explaining a method of injecting charged particles into the first magnetic layer and transforming the first magnetic layer.
Figure 19B:
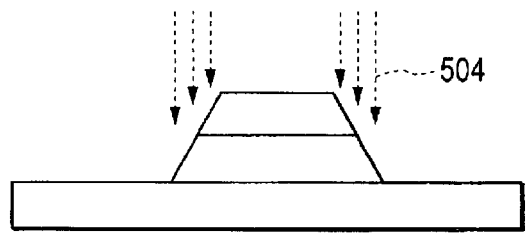
Figure 19C:
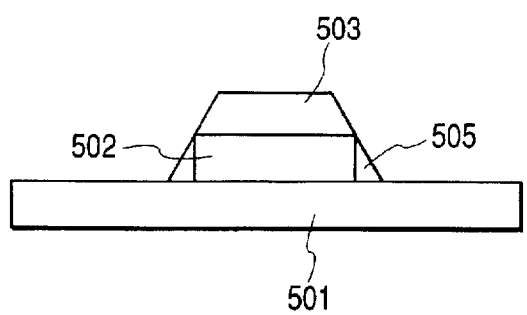

FIGS. 19A to 19C are schematic views for explaining the magnetic element manufacturing method of the fourth embodiment in which charged particles are injected into the first magnetic layer to transform the first magnetic layer, thus obtaining the first magnetic region.

As shown in FIG. 19A, a first magnetic layer 502 and protective layer 503 are formed on a substrate 501.

The first magnetic layer 502 is processed by a focused ion beam (acceleration voltage: 30 kV) from a Ga ion source. FIG. 19B shows the processing state. The first magnetic layer 502 is irradiated with an ion beam 504 to form a transformed, tapered portion at the periphery of the element. The transformed portion of the first magnetic layer 502 serves as a first magnetic region 505 with magnetic perpendicular anisotropy smaller than that of the first magnetic layer. FIG. 19C shows a state after the first magnetic region 505 is formed by transformation.

In the first magnetic region 505, the magnetic coupling chain in the first magnetic layer 502 is partially cut off by Ga ions, decreasing the magnetic anisotropy.

Ions or charged particles used to transform the first magnetic layer 502 are not limited to a Ga focused beam.

An appropriate injection energy of ions or charged particles used to transform the first magnetic layer 502 is 10 to 300 keV. At an energy of 10 keV or less, no satisfactory transformation occurs. At an energy over 300 keV, a target object is physically damaged and may be destructed.

The injection energy is properly selected in accordance with the charged particle or the material, processing shape, or processing location of the first magnetic layer 502 to be transformed.

The portion of the magnetic film to be transformed so as to reduce the perpendicular magnetic anisotropy is not limited to the periphery of the magnetic layer. Such a portion may be set in the stacking direction of the magnetoresistive element, as described in the above embodiments.

Figure 20A:
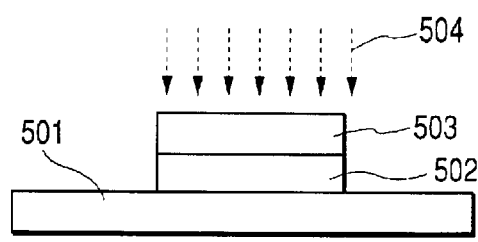
FIGS. 20A, 20B and 20C are schematic views for explaining another method of injecting charged particles into the first magnetic layer and transforming the first magnetic layer.
Figure 20B:
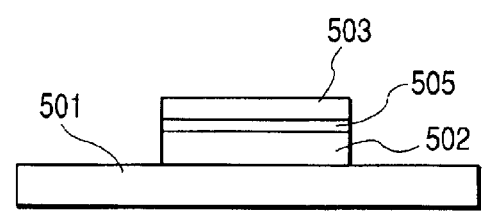
Figure 20C:
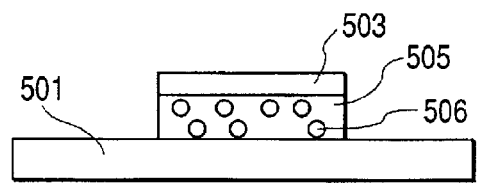

This structure is shown in FIGS. 20A to 20C. As shown in FIG. 20A, ions 504 are implanted via a protective layer 503 to transform the upper surface. FIG. 20B is a sectional view showing a transformed region after ion implantation. A first magnetic region 505 with small perpendicular magnetic anisotropy is formed on a magnetic layer 502. Since the upper surface is transformed by implanting ions via the protective layer 503, the ion implantation amount into the magnetic layer 502 can be adjusted by properly selecting the film thickness of the protective layer. Accordingly, the film thickness of the first magnetic region 505 can be adjusted to a desired one.

If the protective layer 503 is made thinner so as to completely implant a nonmagnetic element 506, the first magnetic layer 502 can be entirely transformed, as shown in FIG. 20C. The area of the region to be transformed is controlled in accordance with the switching field of a desired magnetic film.

The manufacturing method for transforming the magnetic layer 502 to form the first magnetic region 505 is not limited to irradiation of an ion beam such as FIB. For example, the first magnetic layer 502 can be easily transformed by naturally oxidizing it in air.

A third region different from the first magnetic layer and first magnetic region may exist at the boundary between the first magnetic layer and the first magnetic region. The third region may be made of a mixture of the materials of the first magnetic layer and first magnetic region.

In the fourth embodiment, the above-described magnetic film can be applied to the magnetic film of a tunneling magnetoresistive element.

Figure 21:
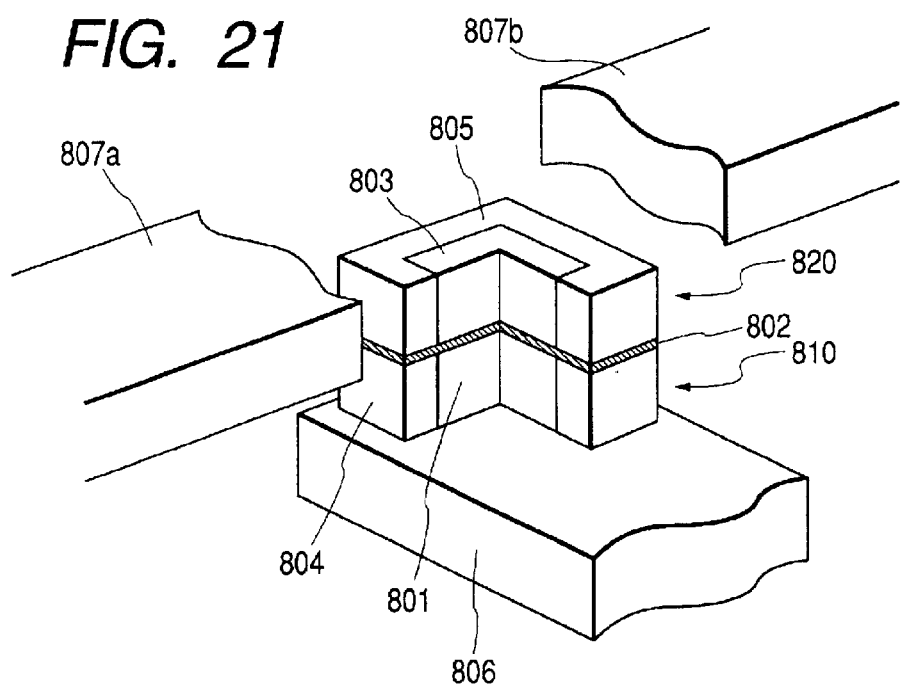
FIG. 21 is a perspective view showing a tunneling magnetoresistive element.

FIG. 21 is a perspective view showing a tunneling magnetoresistive element having a structure in which a nonmagnetic insulating layer is sandwiched between magnetic films according to the fourth embodiment.

The lower magnetic layer of the tunneling magnetoresistive element according to the embodiment is a first magnetic film 810 made up of a first magnetic layer 801 and a first magnetic region 804 formed by transforming the first magnetic layer. The nonmagnetic insulating layer is a tunneling film 802. The upper magnetic layer is a second magnetic film 820 made up of a first magnetic layer 803 and first magnetic region 805. The first magnetic region 805 is an area where the perpendicular magnetic anisotropy is smaller than said first magnetic layer.

The lower and upper magnetic layers have different coercive forces. In an application to an MRAM, the low-coercive-force layer functions as a free layer, and the high-coercive-force layer functions as a pinned layer. Alternatively, the high-coercive-force layer functions as a memory layer, and the low-coercive-force layer functions as a detection layer.

In the fourth embodiment, the first magnetic region 804 of the first magnetic film 810 is so arranged as to surround the first magnetic layer 801. The first magnetic region 805 of the second magnetic film 820 is so arranged as to surround the first magnetic layer 803. The first and second magnetic films 810 and 820 constitute a tunneling magnetoresistive element.

The tunneling magnetoresistive element is electrically connected to a lower sense line 806 and upper sense lines 807a and 807b. In FIG. 21, an upper sense line 807 is divided into the upper sense lines 807a and 807b for illustrative convenience, but is actually one wire.

The lower sense line 806 is connected to the first magnetic layer 801 and first magnetic region 804 of the first magnetic film 810. The upper sense line 807 is connected to the first magnetic layer 803 and first magnetic region 805 of the second magnetic film 820. A sense current flows from one sense line to the other sense line via the tunneling magnetoresistive element. Note that an insulating layer necessary to flow a sense current is not illustrated in FIG. 21.

The coercive force can be reduced by transforming part of the magnetic layer to form a region with small perpendicular magnetic anisotropy, like the fourth embodiment. The use of this magnetoresistance effect in an MRAM enables easily writing information with a small current.

When the magnetic element of the embodiment is applied to a tunneling magnetoresistive element, the magnetic layer can be used for both the upper and lower magnetic layers, as shown in FIG. 21, or can be applied to only the upper or lower magnetic layer.

In transforming the upper magnetic layer by an ion beam, the magnetic layer may be partially or almost entirely transformed.

Figure 22:
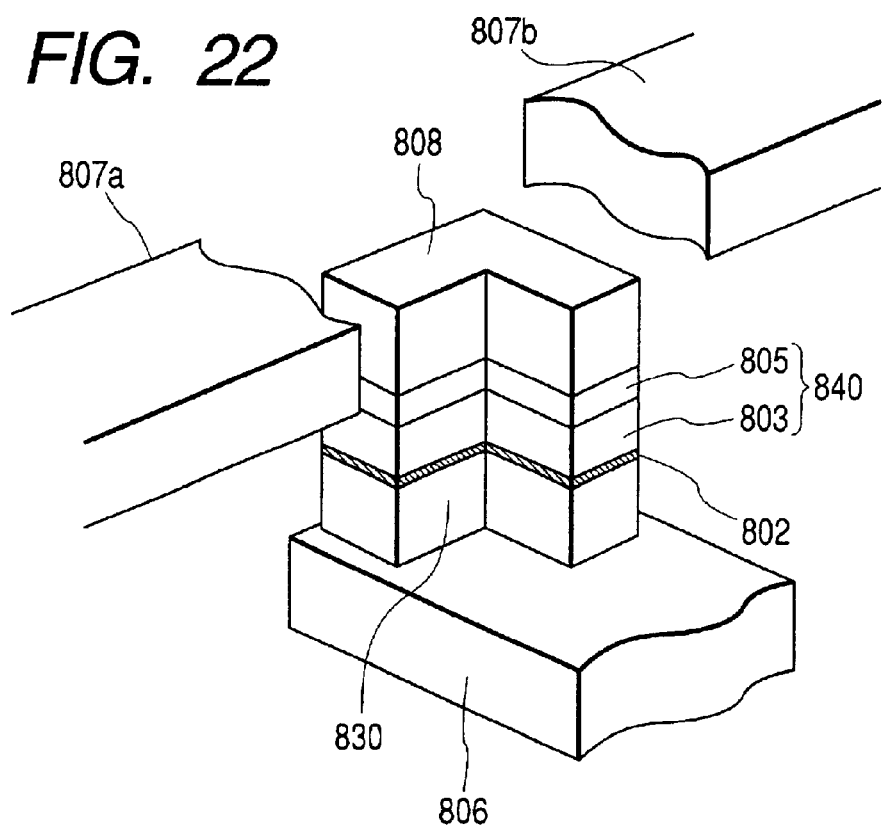
FIG. 22 is a perspective view showing another tunneling magnetoresistive element formed by transforming part of an upper magnetic layer.

FIG. 22 is a perspective view showing a tunneling magnetoresistive element constructed by transforming an upper-surface-side portion of the upper magnetic layer.

The lower magnetic layer is a first magnetic film 830, and the nonmagnetic insulating layer is a tunneling film 802. The upper magnetic layer is a second magnetic film 840 made up of a first magnetic layer 803 and first magnetic region 805. A conductive protective layer 808 prevents any damage by ion implantation.

The lower and upper magnetic layers have different coercive forces. The low-coercive-force layer serves as a free layer, and the high-coercive-force layer serves as a pinned layer.

As a manufacturing method, after processing for defining a memory cell area, an ion beam is emitted to transform the first magnetic layer 803 of the second magnetic film 840. As a result, the first magnetic region 805 with perpendicular magnetic anisotropy smaller than that of the first magnetic layer is formed on the first magnetic layer 803.

In the first magnetic region 805, the magnetic coupling chain in the first magnetic layer 803 is partially decoupled by Ga ions, decreasing the magnetic anisotropy. The coercive force of the second magnetic film 840 serving as a pinned layer can be adjusted by selecting the film thickness of the conductive protective layer 808.

The coercive force can be reduced also in the magnetoresistive film having the above structure. An application of the tunneling magnetoresistive element to an MRAM can reduce power consumption.

Figure 23:
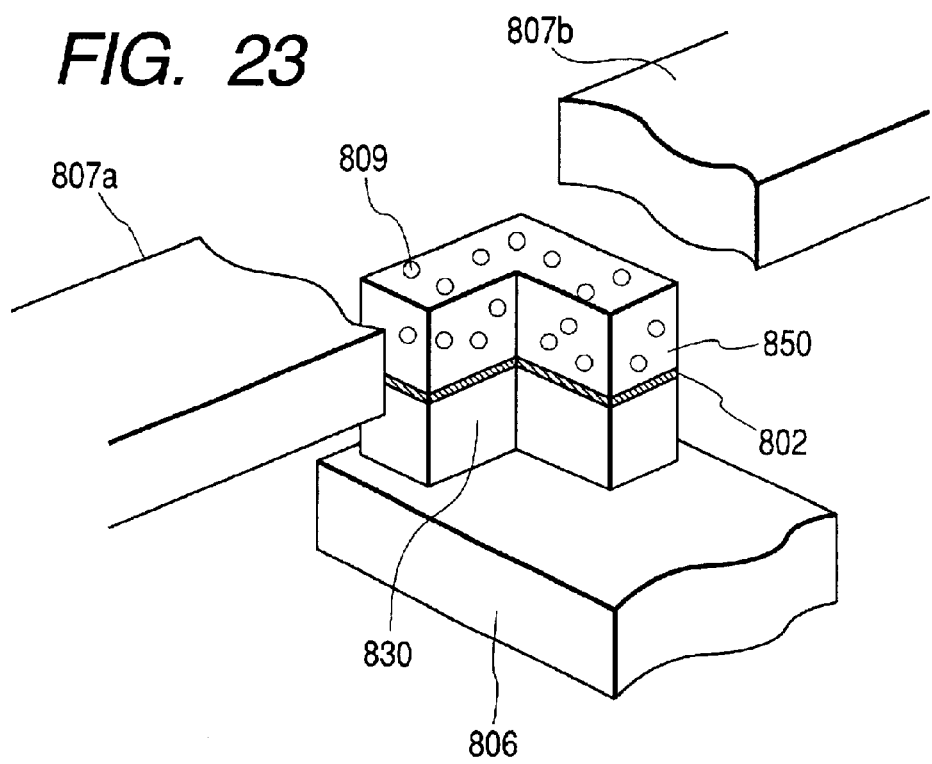
FIG. 23 is a perspective view showing still another tunneling magnetoresistive element formed by transforming the entire upper magnetic layer.
Figure 24A:
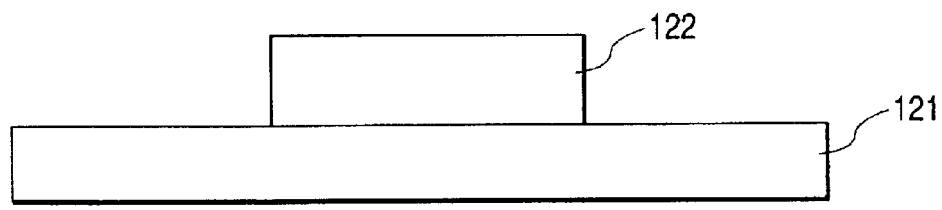
FIGS. 24A, 24B and 24C are schematic views for explaining a method of forming the second magnetic layer by photolithography.
Figure 24B:
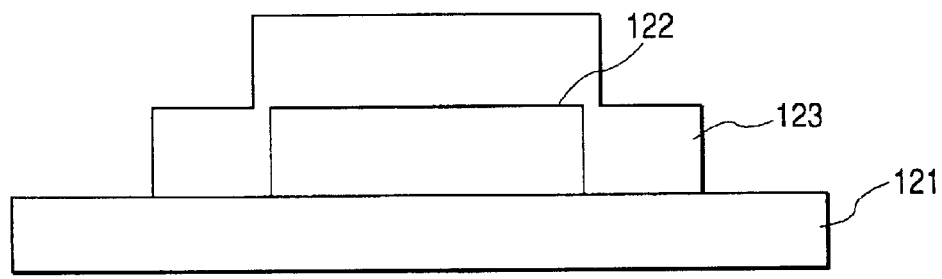
Figure 24C:
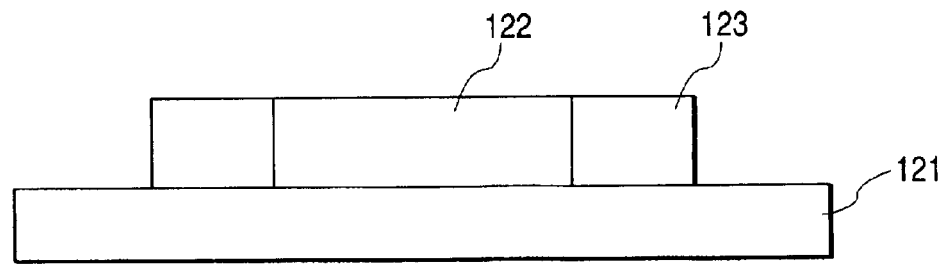

FIG. 23 is a perspective view showing a tunneling magnetoresistive element formed by transforming the whole upper magnetic layer.

In FIG. 23, the lower magnetic layer is a first magnetic film 830. The nonmagnetic insulating layer is a tunneling film 802, and the upper magnetic layer is a second magnetic film 850.

After processing for defining a memory cell area, an ion beam is emitted to transform the entire upper magnetic layer, thus forming the second magnetic film 850. A nonmagnetic element 809 is injected into the second magnetic film 850. By selecting the injection energy at this time, the coercive force of the second magnetic element 850 can be adjusted.

The coercive force can be reduced also in the magnetoresistive film having this structure. An application of the tunneling magnetoresistive element to an MRAM can reduce power consumption.

A process of forming a magnetic element with reduced perpendicular magnetic anisotropy by ion beam irradiation is relatively easily introduced into the tunneling magnetoresistive element manufacturing process because of the absence of any mask formation step. Since a main portion can be processed with a pinpoint precision, the processing productivity for reducing the coercive force is high.

Applications of the magnetic element of the fourth embodiment are not limited to only a tunneling magnetoresistive element. The magnetic element of this embodiment can be widely applied when a low-coercive-force magnetic element is required in a micropatterned magnetic application product.

(Fifth Embodiment)

Another tunneling magnetoresistive element using a magnetic film with a reduced coercive force will be described.

In the tunneling magnetoresistive element, a nonmagnetic insulating layer was sandwiched between lower and upper magnetic layers. The upper and lower magnetic layers were formed from magnetic films prepared by transforming magnetic layers to reduce the coercive forces.

As shown in FIG. 21, the upper and lower magnetic layers were formed by a manufacturing method of transforming side walls by oxidization after ion milling processing.

The tunneling magnetoresistive element formation method will be explained with reference to FIGS. 25A to 25C.

Figure 25A:
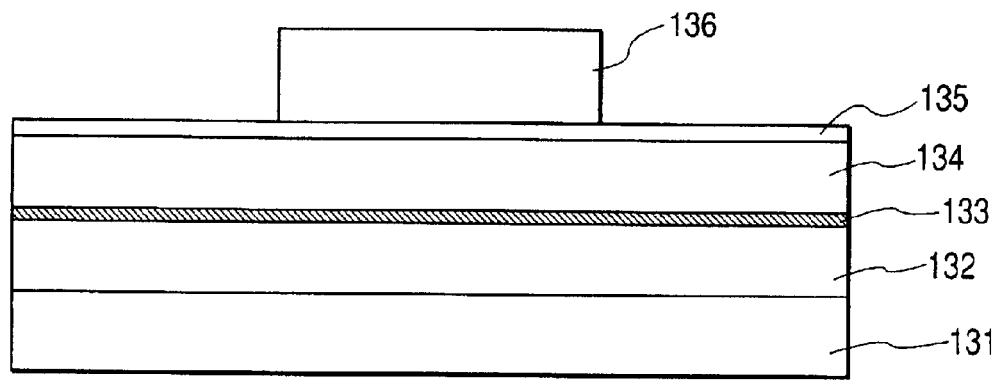
FIGS. 25A, 25B and 25C are schematic views for explaining a tunneling magnetoresistive element formation method.

FIG. 25A is a schematic view showing the sectional shape of a tunnel junction before processing. A magnetic layer 132, magnetic layer 134, conductive protective layer 135, and pattern-formed resist 136 are formed on a substrate 131. A tunneling film 133 is interposed between the magnetic layers 132 and 134. An element is processed by ion milling, RIE, or the like. After processing, it is widely used to bury the periphery by an insulating film while keeping the resist 136 left, and complete the tunnel junction by lift-off.

Figure 25B:
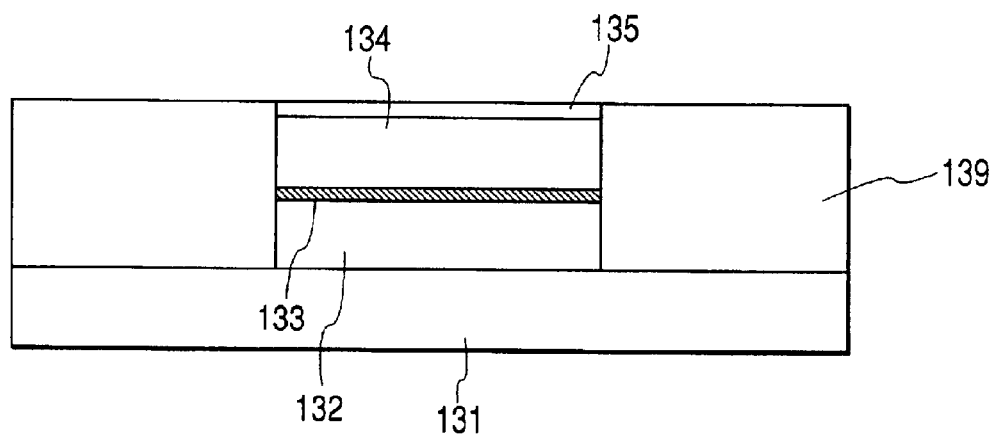

FIG. 25B is a view for comparison, and is a sectional view showing a tunnel junction after processing of forming an element by ion milling using a resist mask prepared by photolithography. A tunnel junction is formed in a region where the resist 136 is left. The two sides of this region are buried by an insulating layer 139.

Figure 25C:
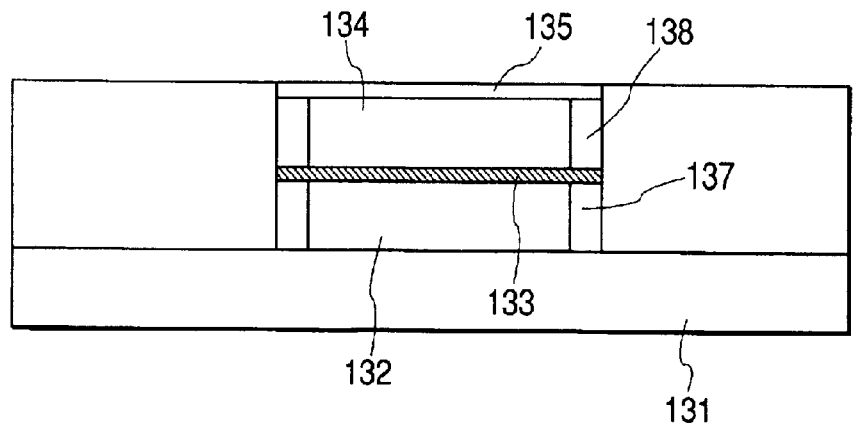
Figure 1:
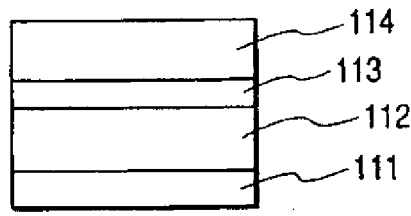
Figure 2:
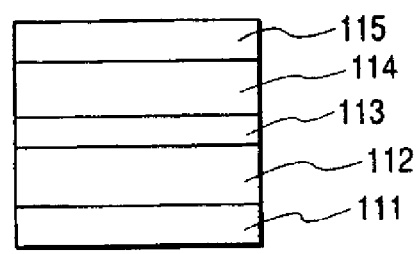
Figure 3:
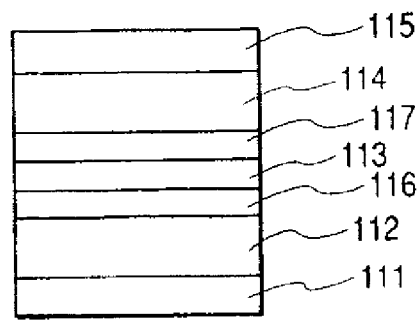
Figure 4:
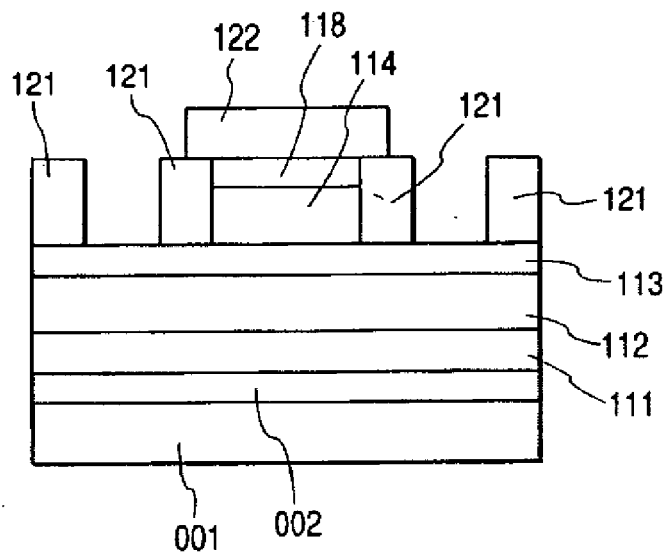
Figure 5:
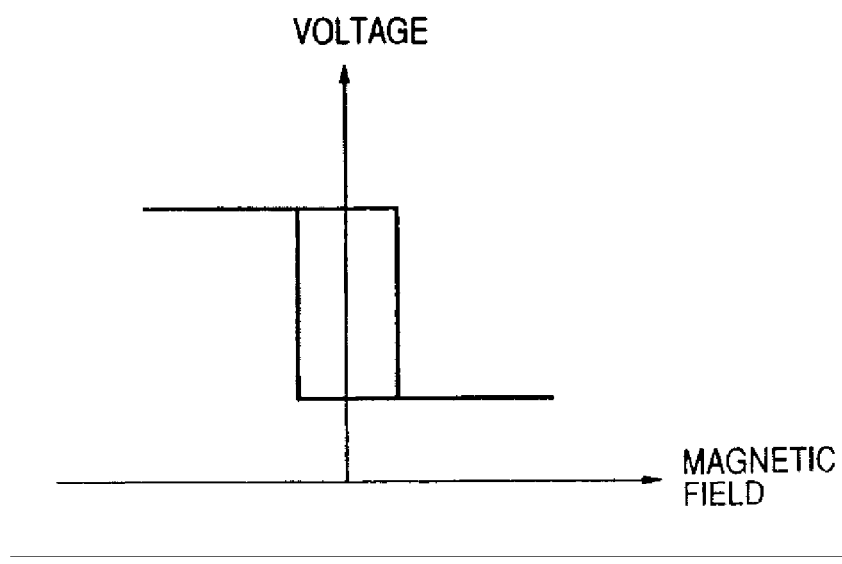
Figure 6:
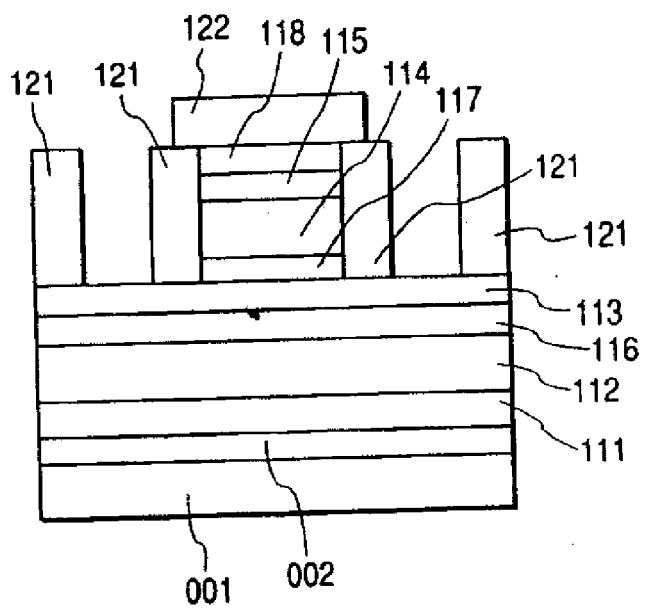
Figure 7:
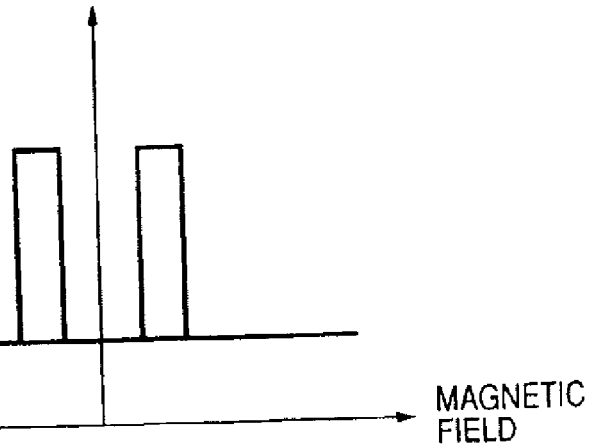
Figure 8:
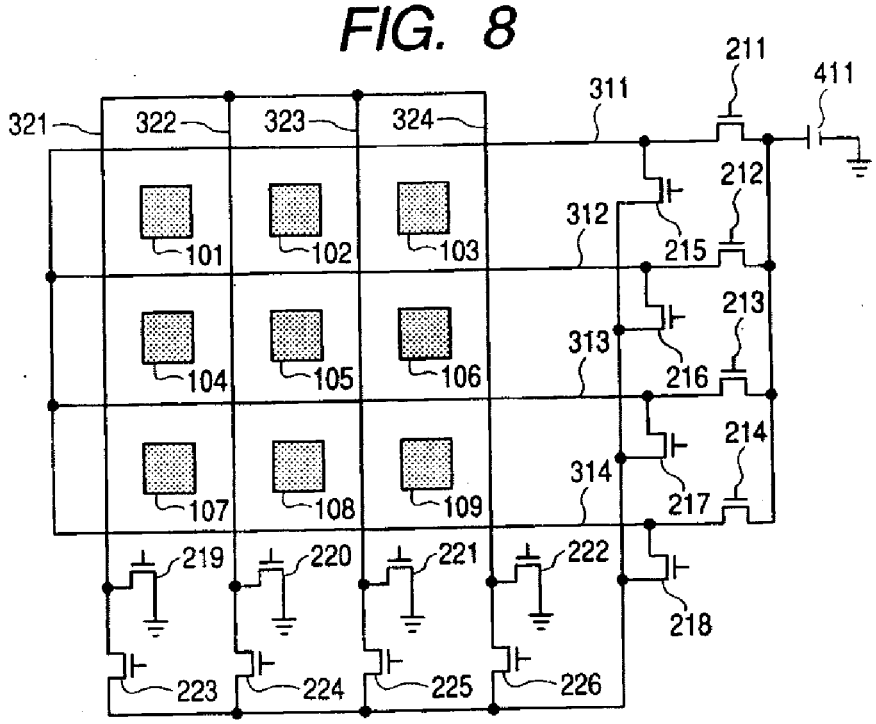
Figure 9:
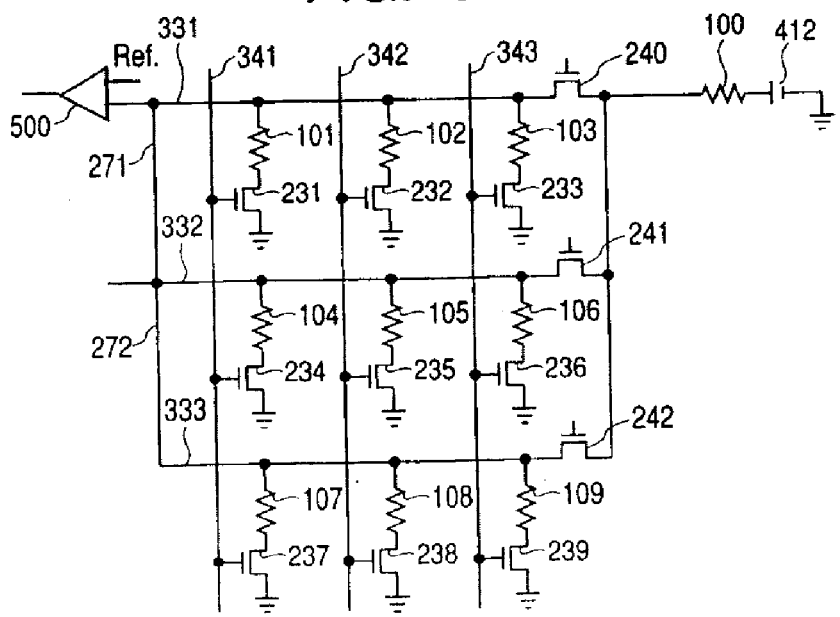

FIG. 25C is a sectional view showing a tunnel junction around which the second magnetic region transformed from the first magnetic layer is formed by oxidizing the side wall of the first magnetic layer.

As is apparent from a comparison with FIG. 25B, a magnetic layer 137 transformed from the magnetic layer 132 and a magnetic layer 138 transformed from the magnetic layer 134 are formed around the tunnel junction. The magnetic layer 137 corresponds to the first magnetic region when the magnetic layer 132 is defined as the first magnetic layer. The magnetic layer 138 corresponds to the second magnetic layer when the magnetic layer 134 is defined as the first magnetic layer.

The formation process will be explained.

The substrate 131 was a (1,0,0) Si wafer having a 1-μm thermal oxide film.

Table 1 shows the materials and film thicknesses of the magnetic layers 132 and 134, tunneling film 133, and conductive protective layer 135 formed on the substrate 131. These films were formed by magnetron sputtering. The tunneling film 133 was formed by Rf-sputtering $Al_2O_3$ and performing oxide plasma processing (0.2 Pa, Rf 5W, 30 sec).

TABLE 1

| Name | Material | Film Thickness (nm) |
|---|---|---|
| Magnetic Layer (nm) | $Gd_{22}Fe$ | 50 |
| Tunneling Film 133 | $Al_2O_3$ | 1.5 |
| Magnetic Layer 134 | $Tb_{20}Fe$ | 25 |
| Conductive Protective Layer 135 | Si | 50 |

After film formation, a resist was applied to a sample, and the mask pattern of a tunnel junction was formed by photolithography. More specifically, a resist film having a thickness of about 1.2 μm was formed using LOR-P003 available from TOKYO OHKA KOGYO. Contact exposure was done by halogen light to form a pattern.

The substrate bearing the resist pattern was loaded into an ion milling apparatus, and underwent processing for forming a tunneling element.

Immediately after the end of processing, a substrate on which an insulating layer was formed was used as a comparative sample. The comparative sample had a sectional shape as shown in FIG. 25B.

After the end of processing, a substrate was temporarily exposed to air to form magnetic layers 137 and 138, and an insulating layer 139 was further formed. The resultant substrate was adopted as a sample of the fifth embodiment. This sample had a sectional shape as shown in FIG. 25C.

The substrate having undergone tunnel junction processing underwent photolithography again, and a resist mask for an upper electrode was formed. A 50-nm thick Al film was formed as an upper electrode film by a magnetron sputtering apparatus, completing a tunneling magnetoresistive element. The junction area was 200 $μm^2$.

The characteristics of the element were measured and evaluated by a magnetoresistance measurement apparatus. An external magnetic field was applied up to 1 kOe, and a current flowing through the element was set to 1 μA. To eliminate the influence of the contact resistance of a probe, four-terminal measurement was performed. A magnetic field which caused magnetization switching was defined as Hc, and the value of the magnetic field Hc was compared between the sample of the fifth embodiment and the comparative sample. The result is shown in Table 2.

(Sixth Embodiment)

Still another tunneling magnetoresistive element using a magnetic film with a reduced coercive force will be described.

As shown in FIG. 21, upper and lower magnetic layers were formed by a manufacturing process of transforming side walls by FIB. The layered structure of the substrate and magnetic film of a sample used for an experiment, and a comparative sample were identical to those in the fifth embodiment.

After film formation, a sample was micropatterned by photolithography to form a lower electrode and the like. A single-layered magnetic film was formed, and processing of forming a tunneling element by a focused ion beam (acceleration voltage: 30 kV) from a Ga ion source was performed, similar to FIG. 19B.

Similar to FIG. 19B, a focused ion beam was so emitted as to taper the periphery of the element, thereby transforming the peripheries of the upper and lower magnetic layers. At the transformed portion, the magnetic coupling chain inside the upper magnetic layer was partially decoupled by Ga ions, decreasing the perpendicular magnetic anisotropy.

The substrate having undergone tunnel junction processing underwent photolithography again, and a resist mask for an upper electrode was formed. A 50-nm thick Al film was formed as an upper electrode film by a magnetron sputtering apparatus, completing a tunneling magnetoresistive element.

The characteristics of the magnetic element were evaluated under the same conditions as those in the fifth embodiment. The result is shown in Table 2.

(Seventh Embodiment)

Still another tunneling magnetoresistive element using a magnetic film with a reduced coercive force will be described.

As shown in FIG. 22, an upper magnetic layer was partially transformed by ion beam irradiation. The layered structure of the substrate and magnetic film of a sample used for an experiment, and a comparative sample were identical to those in the fifth embodiment except for a nonmagnetic conductive layer. The nonmagnetic conductive layer was formed from Si with a thickness of 25 nm in order to enable partial ion implantation.

After film formation, a sample was micropatterned by photolithography to form a lower electrode and tunneling element. A single-layered magnetic element was formed, and processing of partially transforming an upper magnetic layer by a focused ion beam (acceleration voltage: 30 kV) from a Ga ion source was performed, similar to FIGS. 20A and 20B.

The substrate having undergone tunnel junction processing underwent photolithography again, and a resist mask for an upper electrode was formed. A 50-nm thick Al film was formed as an upper electrode film by a magnetron sputtering apparatus, completing a tunneling magnetoresistive element.

The characteristics of the magnetic element were evaluated under the same conditions as those in the fifth embodiment. The result is shown in Table 2.

(Eighth Embodiment)

Still another tunneling magnetoresistive element using a magnetic film with a reduced coercive force will be described.

As shown in FIG. 23, an upper magnetic layer was entirely transformed by ion beam irradiation. The layered structure of the substrate and magnetic film of a sample used for an experiment, and a comparative sample were identical to those in the fifth embodiment except for a nonmagnetic conductive layer. The nonmagnetic conductive layer was formed from Si with a thickness of 5 nm in order to enable entire ion implantation.

After film formation, a sample was micropatterned by photolithography to form a lower electrode and the like. A single-layered magnetic film was formed, and processing of entirely transforming an upper magnetic layer by a focused ion beam (acceleration voltage: 30 kV) from a Ga ion source was performed, similar to FIGS. 20A to 20C.

The substrate having undergone tunnel junction processing underwent photolithography again, and a resist mask for an upper electrode was formed. A 50-nm thick Al film was formed as an upper electrode film by a magnetron sputtering apparatus, completing a tunneling magnetoresistive element.

The characteristics of the magnetic element were evaluated under the same conditions as those in the fifth embodiment. The result is shown in Table 2.

TABLE 2

|  | Hc (kOe) |
| --- | --- |
| Fifth Embodiment | 0.48 |
| Sixth Embodiment | 0.36 |
| Seventh Embodiment | 0.41 |
| Eighth Embodiment | 0.50 |
| Comparative Example | 0.62 |

The present invention is not limited to the embodiments described above, and may be practiced by combining a plurality of embodiments. A tunneling magnetoresistive element suitably used for an MRAM has been exemplified as a magnetoresistive element. However, the present invention is not limited to this, and the structure of the present invention can also be applied to, e.g., a giant magnetoresistive element in which a nonmagnetic layer is made of a conductor.

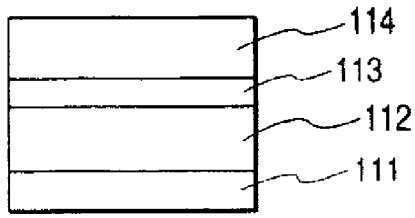

What is claimed is:

1. A magnetoresistive film comprising:
   a second magnetic film;
   a third magnetic film;
   a nonmagnetic film arranged between a first side of the second magnetic film and a first side of the third magnetic film; and
   a first magnetic film, whose easy axis of magnetization is inclined from a direction perpendicular to a film surface, formed at a position of a second side of the second magnetic film,
   wherein the second and third magnetic films are perpendicular magnetization films.

2. A film according to claim 1, wherein said first magnetic film and said second magnetic film are exchange-coupled to each other.

3. A film according to claim 1, wherein a layer having a spin polarization higher than a spin polarization of at least one of said perpendicular magnetization films is inserted between said perpendicular magnetization film and said nonmagnetic film, and said at least one of said perpendicular magnetization films and said layer having the high spin polarization are exchange-coupled to each other.

4. A film according to claim 1, further comprising a fourth magnetic film, whose easy axis of magnetization is inclined from the direction perpendicular to the film surface, formed at a position of a second side of the third magnetic film, wherein said first and second magnetic films and said third and fourth magnetic films are respectively exchange-coupled to each other.

5. A film according to claim 4, a layer having a spin polarization higher than a spin polarization of said second magnetic film is inserted between said second magnetic film and said nonmagnetic film, a layer having a spin polarization higher than a spin polarization of said third magnetic film is inserted between said third magnetic film and said nonmagnetic film, end said layer having the high spin polarization and second magnetic film and said layer having the high spin polarization and third magnetic film are respectively exchange-coupled to each other.

6. A film according to claim 1, wherein magnetization of said magnetic film whose easy axis of magnetization orients in a direction inclined from the direction perpendicular to the film surface is at least partially inclined from the direction perpendicular to the film surface while said magnetic film is exchange-coupled to said perpendicular magnetization film.

7. A film according to claim 1, wherein at least one of said perpendicular magnetization films is a ferrimagnetic layer formed from an amorphous alloy of a rear-earth metal and a transition metal.

8. A film according to claim 1, wherein said nonmagnetic film includes an insulator.

9. A memory having a memory element with said magnetoresistive film defined in claim 1, comprising:
means for applying a magnetic field to said magnetoresistive film in a direction perpendicular to a film surface; and
means for detecting a resistance of said magnetoresistive film.

10. A memory according to claim 9, wherein said means for applying the magnetic field includes a conductor.

11. A memory according to claim 9, further comprising means for applying a magnetic field to said magnetoresistive film in a direction inclined from the direction perpendicular to the film surface.

12. A memory according to claim 9, wherein in recording information, of said magnetic films which sandwich said nonmagnetic film, a magnetization direction of said magnetic film in contact with said magnetic film whose easy axis of magnetization is inclined from the direction perpendicular to the film surface is changed, and the magnetization direction of said other magnetic film is kept unchanged to record/reproduce information.

13. A memory according to claim 9, wherein, of said magnetic films formed in contact with said nonmagnetic film, said magnetic film whose magnetization orients in the direction perpendicular to the film surface in absence of a magnetic field is set as a recording layer, and said other magnetic film is set as a read-out layer.

14. A memory according to claim 9, wherein, of said magnetic films formed in contact with said nonmagnetic film, magnetization of said magnetic film formed in contact with one film surface of said nonmagnetic film is not switched by a magnetic field applied in recording or read, and magnetization of said magnetic film formed in contact with the other film surface of said nonmagnetic film is switched.

15. A memory according to claim 9, wherein a plurality of magnetoresistive films are arranged, and said memory further comprises means for selectively recording information on a desired magnetoresistive film, and means for selectively reading out information recorded on a desired magnetoresistive film.

16. A magnetic element of a magnetoresistive film using a coercive force of a magnetic substance, comprising:
a first magnetic layer formed on a substrate; and
a first magnetic region which has perpendicular magnetic anisotropy smaller than perpendicular magnetic anisotropy of said first magnetic layer and is in contact with said first magnetic layer.

17. A magnetoresistive element comprising:
a nonmagnetic film; and
magnetic films formed on two sides of said nonmagnetic film, at least one of said magnetic films including said magnetic element defined in claim 16.

18. A memory comprising:
a substrate;
a plurality of magnetoresistive elements defined in claim 17 on said substrate;
means for applying a magnetic field to said magnetoresistive elements along an easy axis of magnetization; and
means for detecting resistances of said magnetoresistive elements.

19. A method of manufacturing a magnetic element of a magnetoresistive film comprising the steps of:
forming a first magnetic layer on a substrate; and
injecting charged particles to transform the first magnetic layer, thereby forming a magnetic region in the first magnetic layer having perpendicular magnetic anisotropy smaller than perpendicular magnetic anisotropy of the first magnetic layer.

* * * * *

UNITED STATES PATENT AND TRADEMARK OFFICE
CERTIFICATE OF CORRECTION

PATENT NO.    : 6,829,121 B2
DATED         : December 7, 2004
INVENTOR(S)   : Takashi Ikeda et al.

It is certified that error appears in the above-identified patent and that said Letters Patent is hereby corrected as shown below:

Drawings sheets, consisting of Fig. 1 - 9, should be deleted and replaced with the drawing sheets, consisting of Fig. 1 - 9, as shown on the attached pages.

Column 2,
Lines 38, 51, 54 and 58, "rear-earth" should read -- rare-earth --.

Column 4,
Line 50, "rear-earth" should read -- rare-earth --.

Column 6,
Line 16, "rear-earth" should read -- rare-earth --; and
Line 59, "an" first occurrence should read -- a --.

Column 8,
Line 59, "rear-earth" should read -- rare-earth --.

Column 12,
Lines 3, 6, 8, 14, 16, 26, 28, 30 (both occurrences), 31 and 49, "rear-earth" should read -- rare-earth --.

Column 19,
Line 7, "end" should read -- and --; and
Line 20, "rear-earth" should read -- rare-earth --.

Signed and Sealed this

Thirty-first Day of May, 2005

JON W. DUDAS
*Director of the United States Patent and Trademark Office*

(12) United States Patent
Ikeda et al.

(10) Patent No.: US 6,829,121 B2
(45) Date of Patent: Dec. 7, 2004

(54) MAGNETORESISTIVE ELEMENT, MEMORY ELEMENT HAVING THE MAGNETORESISTIVE ELEMENT, AND MEMORY USING THE MEMORY ELEMENT

(75) Inventors: Takashi Ikeda, Kanagawa (JP); Akio Koganei, Chiba (JP); Kazuhisa Okano, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/113,983

(22) Filed: Apr. 2, 2002

(65) Prior Publication Data
US 2002/0182442 A1 Dec. 5, 2002

(30) Foreign Application Priority Data
Apr. 2, 2001 (JP) .................................. 2001/103185
Aug. 13, 2001 (JP) .................................. 2001/245423

(51) Int. Cl.$^7$ ............................. G11B 5/127; G11B 5/39
(52) U.S. Cl. .......................... 360/324.1; 360/324.2; 428/611; 428/686; 428/212; 428/692; 427/526; 427/528; 427/531; 427/598
(58) Field of Search ....................... 428/692, 693, 428/209, 210, 611, 686, 212; 360/313, 324.1, 324.2; 427/526, 528, 531, 598

(56) References Cited
U.S. PATENT DOCUMENTS

| | | | |
|---|---|---|---|
| 5,652,054 A | 7/1997 | Kikitsu et al. | 428/328 |
| 5,726,837 A | 3/1998 | Nakatani et al. | 360/113 |
| 5,729,410 A | 3/1998 | Fontana, Jr. et al. | 360/113 |
| 6,219,275 B1 | 4/2001 | Mishimura | 365/173 |
| 6,565,929 B2 * | 5/2003 | Gurovich et al. | 427/523 |
| 2001/0018107 A1 * | 8/2001 | Ishii | 428/65.3 |
| 2002/0044479 A1 * | 4/2002 | Ikeda | 365/145 |
| 2002/0131214 A1 * | 9/2002 | Covington et al. | 360/324 |

FOREIGN PATENT DOCUMENTS

| | | | |
|---|---|---|---|
| GB | 896703 | 5/1962 | |
| JP | 03-108144 | * 5/1991 | G11B.11-10 |

OTHER PUBLICATIONS

Mutsuko Jimbo, et al., "Giant Magnetoresistance In Soft Magnetic NiFeCo/Cu Multilayers With Various Buffer Layers", Journal of Magnetism and Magnetic Materials 126 (1993), pp. 422–424.

V.O. Vas'kovskij, et al., "Amorphous Gadolinium–Cobalt Films With In–plane Anisotropy For Magnetoresistive Sandwiches", Journal of Magnetism and Magnetic Materials 156 (1996), pp. 291–292.

Patent Abstracts of Japan Application No. 11-109571, filed Apr. 16, 1999; Publication No. 2000-306374, published Feb. 11, 2000.

* cited by examiner

Primary Examiner—Paul Thibodeau
Assistant Examiner—Kevin M. Bernatz
(74) Attorney, Agent, or Firm—Fitzpatrick, Cella, Harper & Scinto

(57) ABSTRACT

A magnetoresistive film includes a nonmagnetic film, and a structure in which magnetic films are formed on the two sides of the nonmagnetic film. At least one of the magnetic films is a perpendicular magnetization film. A magnetic film whose easy axis of magnetization is inclined from a direction perpendicular to the film surface is formed at a position where the magnetic film contacts the perpendicular magnetization film but does not contact the nonmagnetic film. A memory, magnetic element, magnetoresistive element, and magnetic element manufacturing method are also disclosed.

19 Claims, 14 Drawing Sheets